(12) United States Patent
Brown et al.

(10) Patent No.: US 11,798,815 B2
(45) Date of Patent: Oct. 24, 2023

(54) METHOD OF METALIZING A GLASS ARTICLE

(71) Applicant: CORNING INCORPORATED, Corning, NY (US)

(72) Inventors: Philip Simon Brown, Big Flats, NY (US); Mandakini Kanungo, Painted Post, NY (US); Prantik Mazumder, Ithaca, NY (US)

(73) Assignee: Corning Incorporated, Corning, NY (US)

( * ) Notice: Subject to any disclaimer, the term of this patent is extended or adjusted under 35 U.S.C. 154(b) by 189 days.

(21) Appl. No.: 17/123,576

(22) Filed: Dec. 16, 2020

(65) Prior Publication Data
US 2021/0210359 A1    Jul. 8, 2021

Related U.S. Application Data

(60) Provisional application No. 62/957,562, filed on Jan. 6, 2020.

(51) Int. Cl.
*H01L 21/48* (2006.01)
*H01L 23/15* (2006.01)
(Continued)

(52) U.S. Cl.
CPC .......... *H01L 21/486* (2013.01); *C03C 17/008* (2013.01); *C03C 17/36* (2013.01);
(Continued)

(58) Field of Classification Search
CPC ... C03C 17/008; C03C 17/36; C03C 17/3644; C03C 17/3602; C03C 17/3639;
(Continued)

(56) References Cited

U.S. PATENT DOCUMENTS

| 6,417,124 B1 * | 7/2002 | Peuchert ............... C03C 3/091 |
| | | 313/493 |
| 2013/0026969 A1 * | 1/2013 | Kim ................... H01M 50/107 |
| | | 320/103 |

(Continued)

OTHER PUBLICATIONS

Olweya et al., "Fine-line Silver Pastes for Seed Layer Screen Printing with Varied Glass Content", Sci. Direct, Energy Procedia, vol. 43, 2013, pp. 37-43.
(Continued)

*Primary Examiner* — Shaun M Campbell
*Assistant Examiner* — Aneta B Cieslewicz
(74) *Attorney, Agent, or Firm* — Kevin L. Bray

(57) ABSTRACT

A method of manufacturing a glass article comprising: forming a first layer of a first metal on a glass substrate, the glass substrate comprising silicon dioxide and aluminum oxide; subjecting the glass substrate with the first layer of the first metal to a first thermal treatment; forming a second layer of a second metal over the first layer of the first metal; and subjecting the second layer of the second metal to a second thermal treatment, the first thermal treatment and the second thermal treatment inducing intermixing of the first metal, the second metal, and at least one of aluminum, aluminum oxide, silicon, and silicon dioxide of the glass substrate to form a metallic region comprising the first metal, the second metal, aluminum oxide, and silicon dioxide. The first metal can be silver. The second metal can be copper.

18 Claims, 15 Drawing Sheets

(51) Int. Cl.
*C03C 17/36* (2006.01)
*C03C 17/40* (2006.01)
*C03C 17/00* (2006.01)
*C03C 3/091* (2006.01)
*H01L 23/498* (2006.01)

(52) U.S. Cl.
CPC ...... *C03C 17/3644* (2013.01); *C03C 17/3647* (2013.01); *C03C 17/3694* (2013.01); *C03C 17/40* (2013.01); *H01L 23/15* (2013.01); *H01L 23/49827* (2013.01); *H01L 23/49838* (2013.01); *H01L 23/49866* (2013.01); *C03C 3/091* (2013.01); *C03C 2217/23* (2013.01); *C03C 2217/25* (2013.01); *C03C 2217/253* (2013.01); *C03C 2217/256* (2013.01); *C03C 2217/27* (2013.01); *C03C 2217/29* (2013.01); *C03C 2217/40* (2013.01); *C03C 2217/91* (2013.01)

(58) Field of Classification Search
CPC ............ C03C 17/3642; C03C 17/3647; C03C 17/3694; C03C 17/40; C03C 2217/25; C03C 2217/253; C03C 2217/256; C03C 2217/27; C03C 2217/29; C03C 2217/40; C03C 2217/91; C03C 2217/213; C03C 2217/214; C03C 2217/23; C03C 2218/365; C03C 3/091; H01L 23/15; H01L 23/49827; H01L 23/49838; H01L 23/19866; H01L 21/486
See application file for complete search history.

(56) References Cited

U.S. PATENT DOCUMENTS

| | | |
|---|---|---|
| 2013/0228918 A1* | 9/2013 | Chen .................. H01L 23/5384 257/737 |
| 2019/0239353 A1 | 8/2019 | Jayaraman |
| 2019/0313524 A1 | 10/2019 | Huang et al. |
| 2019/0363010 A1 | 11/2019 | Brown et al. |
| 2019/0378773 A1 | 12/2019 | Brown et al. |

OTHER PUBLICATIONS

International Search Report and Written Opinion of the International Searching Authority; PCT/US2020/064409; dated Mar. 23, 2021, 10 pages; European Patent Office.

* cited by examiner

METHOD OF METALIZING A GLASS ARTICLE

This Application claims priority under 35 USC § 119(e) from U.S. Provisional Patent Application Ser. No. 62/957,562 filed on Jan. 6, 2020 which is incorporated by reference herein in its entirety.

BACKGROUND

Semiconductor packaging technologies have evolved in significant ways over the years. Early on, the approach to package higher complexity semiconductor circuits (and therefore achieving higher functionality and performance in a given package) was to increase the size of a semiconductor chip in two dimensions within the package. As a practical matter, one cannot expand laterally in two dimensions without bound because eventually the design will suffer in terms of power and signal routing complexities, power dissipation problems, performance problems, manufacturing yield problems, etc.

As a result, there have been efforts to expand semiconductor chips vertically. Among those efforts include so-called two-and-a-half-dimensional (2.5D) and three-dimensional (3D) integration, whereby an interposer is employed to interconnect two or more semiconductor chips within a single package. As used herein, the term "interposer" generally refers to any structure that extends or completes the electrical connection between two or more electronic devices. The primary function of the interposer is to provide interconnectivity in such a way that the two or more semiconductor chips may employ high terminal pitch and avoid the need for vias through the semiconductor chips themselves. The technique involves flipping the semiconductor chips over from their usual configuration and orienting the chip substrates up and chip-sides down. The chips are provided with micro-bump terminals (at high pitch), which are connected to corresponding terminals on a top side of the interposer. The opposite, bottom side of the interposer is connected to the package substrate (which is typically organic) by way of suitable terminals, usually Controlled Collapse Chip Connection (C4) joints. The interposer is provided with through-vias so that electrical connections may be made from the terminals of the semiconductor chips on the top side of the interposer to the terminals of the package substrate at the bottom side of the interposer.

Heretofore, the base substrate for the interposer has typically been silicon. Metalized vias through the substrate provide a path through the interposer for electrical signals to pass between opposite sides of the interposer. While the silicon interposer is a promising and useful technology to achieve vertical integration of semiconductor chips, silicon interposers present problems, particularly in terms of mismatches in coefficients of thermal expansion (CTEs) through the stack, including CTE match-up between the silicon interposer and the organic package substrate. Undesirable CTE mismatches may result in failures in the interconnections between the semiconductor chips and the silicon interposer and/or failures in the interconnections between the silicon interposer and the package substrate. In addition, silicon interposers are relatively expensive and suffer from high dielectric loss due to the semiconducting property of silicon.

Organic interposers (e.g., Flame Retardant 4 (FR4)) have also been introduced. However, organic interposers likewise present problems in terms of dimensional stability.

Glass as the base substrate of the interposer would solve many of the problems that silicon and organic interposers present. Glass is a substrate material that is highly advantageous for electrical signal transmission, because glass has good dimensional stability, a tunable coefficient of thermal expansion ("CTE"), low electrical loss at high frequencies, high thermal stability, and an ability to be formed at thickness and at large panel sizes.

However, there is a problem in that metallization of the vias of glass substrates, to provide the electrically conductive pathway, has heretofore proven difficult. Some conductive metals (particularly copper) do not adhere well to glass, including the primary planar surfaces and the sidewall surface of the vias. Without being bound by theory, it is suspected that the poor bonding of the conductive metal to glass is a consequence of the difference in the type of bonds that hold metal together on one hand and glass together on the other. Glass, stated simply, is a network of covalently bonded oxide molecules (such as silicon dioxide, aluminum oxide, and boron oxide). Metal consists of a "sea" of electrons that move freely throughout a lattice of stationary cationic atomic nuclei. The bonding mechanism of glass is fundamentally different from the bonding mechanism of metal and therefore limits adhesion between metals and glass. This problem can be alleviated by roughening the glass surface to which the metal is to be bonded, which provides for mechanical interlocking between the metal and the glass. However, roughening glass surfaces can cause additional problems that make that approach less than ideal. Accordingly, a new approach to solving the problem of metalizing the vias of glass substrates intended to be used as interposers, and adhering metal to glass substrates in general, is needed.

SUMMARY

The present disclosure solves that problem by: (a) selecting a glass substrate with a composition that includes aluminum oxide in addition to silicon dioxide; (b) depositing a first layer of a first metal, such as silver, onto the desired surfaces of the glass substrate (such as the sidewall surface of the vias); (c) thermally treating the glass substrate with the first layer; (d) depositing a second layer of a second metal, such as copper, over the first layer (such as filling the remaining voids of the vias to fully metalize the vias); and (e) again thermally treating the glass substrate with the second layer. The thermal treatment steps intermix the first metal, the second metal, and aluminum (or aluminum oxide) and silicon (or silicon dioxide) from the glass substrate to form a glass article (e.g., interposer) with a metallic region that includes the first metal, the second metal, aluminum oxide, and silicon dioxide. The metallic region includes predominately the first metal and the second metal but also aluminum oxide and silicon dioxide. This substantially intermixed first metal, second metal, aluminum oxide, silicon dioxide in the metallic region strongly adheres the first metal and the second metal to the glass substrate. Without being bound by theory, it is thought that the intermixed aluminum oxide and silicone dioxide throughout the metallic region results in covalent bonding throughout the glass article including the metallic region and the glass substrate.

According to a first aspect of the present disclosure, a method of manufacturing a glass article comprises: forming a first layer of a first metal on a glass substrate, the glass substrate comprising silicon dioxide and aluminum oxide; subjecting the glass substrate with the first layer of the first metal to a first thermal treatment; forming a second layer of a second metal over the first layer of the first metal; and subjecting the second layer of the second metal to a second thermal treatment. The first thermal treatment and the second thermal treatment induces intermixing of the first metal, the second metal, and at least one of aluminum, aluminum oxide, silicon, and silicon dioxide of the glass substrate to form a metallic region comprising the first metal, the second metal, aluminum oxide, and silicon dioxide.

In embodiments, the glass substrate has a first surface and a second surface, which are the primary surfaces of the glass substrate and face in generally opposite directions, and at least one via through the glass substrate defined by a sidewall surface extending from the first surface to the second surface. In embodiments, the first layer of the first metal is formed on the sidewall surface.

In embodiments, the glass substrate is an alkaline earth aluminoborosilicate substrate, alkali aluminosilicate glass substrate, or an alkali aluminoborosilicate glass substrate. In embodiments, the glass substrate is an alkali-free aluminoborosilicate glass substrate. In embodiments, the glass substrate has not been subjected to a procedure to roughen a surface of the glass substrate.

In embodiments, the glass substrate has a composition comprising (on an oxide basis): 6 to 15 mol % $Al_2O_3$. In embodiments, the glass substrate has a composition comprising (on an oxide basis): 64.0 to 71.0 mol % $SiO_2$; 9.0 to 12.0 mol % $Al_2O_3$; 7.0 to 12.0 mol % $B_2O_3$; 1.0 to 3.0 mol % MgO; 6.0 to 11.5 mol % CaO; 0 to 2.0 mol % SrO; 0 to 0.1 mol % BaO; and at least 0.01 mole percent $SnO_2$; wherein $1.00 \leq \Sigma[RO]/[Al_2O_3] \leq 1.25$, where $[Al_2O_3]$ is the mole percent of $Al_2O_3$ and $\Sigma[RO]$ equals the sum of the mole percents of MgO, CaO, SrO, and BaO.

In embodiments, the first metal consists essentially of silver. In embodiments, the first metal comprises one or more of silver, palladium, platinum, ruthenium, nickel, cobalt, and gold.

In embodiments, the forming the first layer of the first metal on the glass substrate comprises spin coating the glass substrate with a suspension of nanoparticles of the first metal. In embodiments, the forming the first layer of the first metal on the glass substrate comprises electroless plating.

In embodiments, the first thermal treatment comprises subjecting the glass substrate with the first layer of the first metal to a temperature of 325° C. or greater. In embodiments, the first thermal treatment comprises subjecting the glass substrate with the first layer of the first metal to a temperature of 325° C. to 425° C. In embodiments, the first thermal treatment comprises subjecting the glass substrate with the first layer of the first metal to a temperature of 325° C. or greater for a time period of 45 minutes or longer. In embodiments, the first thermal treatment comprises subjecting the glass substrate with the first layer of the first metal to a temperature of 325° C. or greater for a time period of 45 minutes to 75 minutes. In embodiments, the first thermal treatment comprises subjecting the glass substrate with the first layer of the first metal to a temperature of 325° C. to 425° C. for a time period of 45 minutes to 75 minutes.

In embodiments, the method further comprises: after forming the first layer of the first metal and before forming the second layer of the second metal over the first layer, determining that the first layer has either (a) a conductivity that is less than a predetermined conductivity or (b) a resistivity that is higher than a predetermined resistivity; and electroless plating an intermediate layer of an intermediate metal over the first layer. In such embodiments, the forming the second layer of the second metal over the first layer of the first metal comprises forming the second layer of the second metal onto the intermediate layer of the intermediate metal. In such embodiments, the first thermal treatment and the second thermal treatment induce intermixing of the first metal, the intermediate metal, the second metal, and at least one of aluminum, aluminum oxide, silicon, and silicon dioxide of the glass substrate to form a metallic region comprising the first metal, the second metal, aluminum oxide, and silicon dioxide.

In embodiments, the forming the second layer of the second metal over the first layer of the first metal comprises electroplating the second layer of the second metal onto the first layer. In embodiments, the second thermal treatment comprises subjecting the glass substrate with the second layer of the second metal to a temperature of at least 300° C. for a time period of at least 20 minutes. In embodiments, the second thermal treatment comprises subjecting the glass substrate with the second layer of the second metal to a temperature of 300° C. to 400° C. for a time period of at least 20 minutes.

According to a second aspect of the present disclosure, a method of manufacturing a glass interposer comprises: forming a first layer of a first metal on a sidewall surface of one or more vias of a glass substrate, the glass substrate comprising silicon dioxide and aluminum oxide; subjecting the glass substrate with the first layer of the first metal to a first thermal treatment; electroplating a second layer of a second metal over the first layer of the first metal to fully metalize the one or more vias; and subjecting the second layer of the second metal to a second thermal treatment, the first thermal treatment and the second thermal treatment inducing intermixing of the first metal, the second metal, and at least one of aluminum, aluminum oxide, silicon, and silicon dioxide of the glass substrate to form a metallic region comprising the first metal, the second metal, aluminum oxide, and silicon dioxide. In embodiments, the first metal consists essentially of silver; and the second metal comprises copper.

In embodiments, the first thermal treatment comprises subjecting the glass substrate with the first layer of the first metal to a temperature of 325° C. or greater for a time period of 45 minutes or longer. In embodiments, the first thermal treatment comprises subjecting the glass substrate with the first layer of the first metal to a temperature of 325° C. or greater for a time period of 45 minutes to 75 minutes. In embodiments, the second thermal treatment comprises subjecting the glass substrate with the second layer of the second metal to a temperature of at least 300° C. for a time period of at least 20 minutes. In embodiments, the second thermal treatment comprises subjecting the glass substrate with the second layer of the second metal to a temperature of 300° C. to 400° C. for a time period of at least 20 minutes.

In embodiments, the glass substrate has a composition comprising (on an oxide basis): 64.0 to 71.0 mol % $SiO_2$; 9.0 to 12.0 mol % $Al_2O_3$; 7.0 to 12.0 mol % $B_2O_3$; 1.0 to 3.0 mol % MgO; 6.0 to 11.5 mol % CaO; 0 to 2.0 mol % SrO; 0 to 0.1 mol % BaO; and at least 0.01 mole percent $SnO_2$; wherein, $1.00 \leq \Sigma[RO]/[Al_2O_3] \leq 1.25$, where $[Al_2O_3]$ is the mole percent of $Al_2O_3$ and $\Sigma[RO]$ equals the sum of the mole percents of MgO, CaO, SrO, and BaO; and wherein, the glass substrate has a coefficient of thermal expansion (CTE) of $20 \times 10^{-7}$ to $50 \times 10^{-7}$/° C.

According to a third aspect of the present disclosure, a glass article comprises: (a) a glass substrate comprising predominately (by weight percentage) silicon dioxide and aluminum oxide; and (b) a metallic region comprising a first metal, a second metal, silicon dioxide, and aluminum oxide, the metallic region further comprising: (i) a sub-region α that comprises predominantly (by weight percentage) the second metal; (ii) a sub-region β that comprises predominately (by weight percentage) the first metal, more of the second metal than silicon dioxide, and more of the second metal than aluminum oxide; and (iii) a sub-region γ that comprises predominantly, by weight percentage, the first metal, more silicon dioxide than the second metal, and more aluminum oxide than the second metal; wherein, of the sub-region α, the sub-region β, and the sub-region γ, the sub-region γ is closest to the glass substrate and the sub-region α is furthest from the glass substrate. In embodiments, the first metal consists essentially of silver, and the second metal comprises copper.

In embodiments, the glass article further comprises: a transitory region disposed between the glass substrate and the sub-region γ, the transitory region comprising, by weight percentage, predominantly silicon dioxide and more of the first metal than aluminum oxide. In embodiments, aluminum oxide is contiguous from the glass substrate through the sub-region α.

In embodiments, the glass article is an interposer comprising a first surface, a second surface, a thickness between the first surface and the second surface, and at least one via open to the first surface that extends at least partially through the thickness toward the second surface, each via being fully metallized with the metallic region disposed about the central axis.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments.

DETAILED DESCRIPTION

Figure 1:
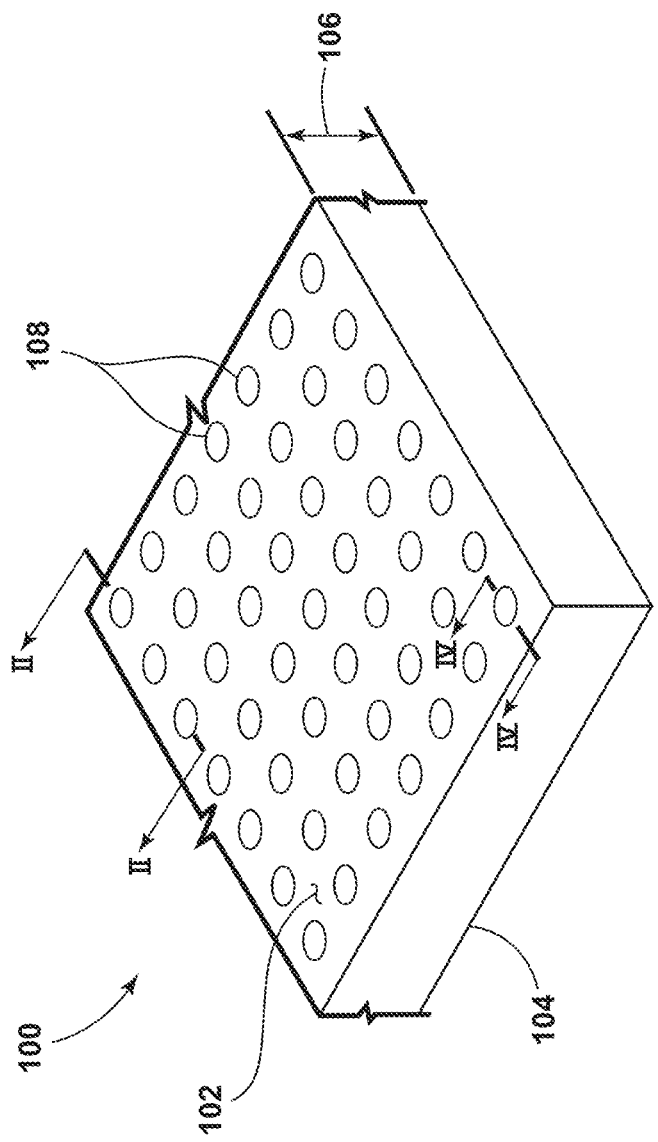
FIG. 1 is a perspective view of a glass substrate to be transformed into an interposer, illustrating a first surface separated from a second surface by a thickness, and vias extending into the thickness and open at the first primary surface.

Reference will now be made in detail to the present preferred embodiments, examples of which are illustrated in the accompanying drawings. Whenever possible, the same reference numerals will be used throughout the drawings to refer to the same or like parts.

Glass Substrate

Referring now to FIG. 1, a glass substrate 100, in the form of an interposer, is illustrated. The glass substrate 100 includes a first surface 102 and a second surface 104. The first surface 102 and the second surface 104 are the primary surfaces of the glass substrate 100. The first surface 102 and the second surface 104 are at least approximately parallel, and face in generally opposite directions.

For reasons that will become apparent, the glass substrate 100 of this disclosure has a composition that comprises aluminum oxide ($Al_2O_3$) or some other metal oxide glass network former. In embodiments, the glass substrate 100 is an alkaline earth aluminoborosilicate substrate, an alkali aluminosilicate glass substrate, an alkali aluminoborosilicate glass substrate, or an alkaline earth aluminoborosilicate glass substrate. In other embodiments, the glass substrate 100 is alkali-free, such as an alkali-free aluminoborosilicate glass substrate or an alkali-free aluminosilicate glass substrate. "Alkali-free" means that the glass substrate 100 contains no purposeful amount of an alkali metal such that any alkali metal in the glass substrate 100 exists as an impurity. In embodiments, the glass substrate 100 has a composition comprising (on an oxide basis): 6 to 15 mol % $Al_2O_3$; and 60 to 78 mol % $SiO_2$.

For example, in some embodiments, the glass substrate 100 comprises (on an oxide basis): 64.0 to 71.0 mol % $SiO_2$; 9.0 to 12.0 mol % $Al_2O_3$; 7.0 to 12.0 mol % $B_2O_3$; 1.0 to 3.0 mol % MgO; 6.0 to 11.5 mol % CaO; 0 to 2.0 mol % SrO; 0 to 0.1 mol % BaO; and at least 0.01 mole percent $SnO_2$; wherein, $1.00 \leq \Sigma[RO]/[Al_2O_3] \leq 1.25$, where $[Al_2O_3]$ is the mole percent of $Al_2O_3$ and $\Sigma[RO]$ equals the sum of the mole percents of MgO, CaO, SrO, and BaO. In such embodiments, the glass substrate 100 can have a coefficient of thermal expansion (CTE) of $20 \times 10^{-7}$ to $50 \times 10^{-7}$/° C., such as $28 \times 10^{-7}$/° C. to $34 \times 10^{-7}$/° C., such as about $31.7 \times 10^{-7}$/° C. "CTE," "coefficient of thermal expansion," and like terms refer to how the size of an object changes with a change in temperature. The CTE measures the fractional change in size per degree change in temperature at a constant pressure, and the size can refer to, for example, volumetric, area, or linear.

In some embodiments, the glass substrate 100 comprises (on an oxide basis): 61 to 75 mol % $SiO_2$; 7 to 15 mol % $Al_2O_3$; 0 to 12 mol % $B_2O_3$; 9 to 21 mol % $Na_2O$; 0 to 4 mol % $K_2O$; 0 to 7 mol % MgO; and 0 to 3 mol % CaO.

In some embodiments, the glass substrate 100 comprises (on an oxide basis): 60 to 70 mol % $SiO_2$; 6 to 14 mol % $Al_2O_3$; 0 to 15 mol % $B_2O_3$; 0 to 15 mol % $Li_2O$; 0 to 20 mol % $Na_2O$; 0 to 10 mol % $K_2O$; 0 to 8 mol % MgO; 0 to 10 mol % CaO; 0 to 5 mol % $ZrO_2$; 0 to 1 mol % $SnO_2$; 0 to 1 mol % $CeO_2$; less than 50 ppm $As_2O_3$; and less than 50 ppm $Sb_2O_3$; wherein 12 mol % $\leq Li_2O+Na_2O+K_2O \leq 20$ mol %; and 0 mol % $\leq MgO+CaO \leq 10$ mol %.

In some embodiments, the glass substrate 100 comprises (on an oxide basis): 64 to 68 mol % $SiO_2$; 12 to 16 mol % $Na_2O$; 8 to 12 mol % $Al_2O_3$; 0 to 3 mol % $B_2O_3$; 2 to 5 mol % $K_2O$; 4 to 6 mol % MgO; and 0 to 5 mol % CaO, wherein: 66 mol % $\leq SiO_2+B_2O_3+CaO \leq 69$ mol %; $Na_2O+K_2O+B_2O_3+MgO+CaO+SrO>10$ mol %; 5 mol % $\leq MgO+CaO+SrO \leq 8$ mol %; $(Na_2O+B_2O_3)-Al_2O_3 \leq 2$ mol %; 2 mol % $\leq Na_2O-Al_2O_3 \leq 6$ mol %; and 4 mol % $\leq (Na_2O+K_2O)-Al_2O_3 \leq 10$ mol %.

In some embodiments, the glass substrate 100 comprises (on an oxide basis): 66 to 78 mol % $SiO_2$; 4 to 11 mol % $Al_2O_3$; 4 to 11 mol % $B_2O_3$; 0 to 2 mol % $Li_2O$; 4 to 12 mol % $Na_2O$; 0 to 2 mol % $K_2O$; 0 to 2 mol % ZnO; 0 to 5 mol % MgO; 0 to 2 mol % CaO; 0 to 5 mol % SrO; 0 to 2 mol % BaO; and 0 to 2 mol % $SnO_2$.

In some embodiments, the glass substrate 100 comprises (on an oxide basis): 69.49 mol % $SiO_2$, 8.45% $Al_2O_3$, 14.01% $Na_2O$, 1.16% $K_2O$, 0.185% $SnO_2$, 0.507% CaO, 6.2% MgO, 0.01% $ZrO_2$, and 0.008% $Fe_2O_3$.

In embodiments, the glass substrate 100 is made by a glass manufacturing system that uses a fusion process to fabricate glass sheets, which are then cut into the desired shape of the glass substrate 100. The fusion process forms the glass substrate 100 with an already uniform thickness, such as with a total thickness variation (TTV) of less than 1.0 μm. Accordingly, polishing or other finishing steps may not be required before use of the glass substrate 100 as an interposer. In the event that the fusion process results in the glass substrate 100 being too thick, then the thickness of the glass substrate 100 can be thinned by any known means such as etching and polishing. In still other embodiments, the glass substrate 100 is made with a non-fusion process and then polished or etched to have the desired thickness. After the glass substrate 100 is made, the glass substrate 100 may be annealed to reduce residual stresses present in the glass substrate 100.

The glass substrate 100 has a thickness 106 that extends from the first surface 102 and the second surface 104. In embodiments, the thickness 106 is within the range of 25 μm to about 1 mm, although thinner or thicker thicknesses 106 are envisioned. For example, for the embodiments described herein, the thickness 106 of the glass substrate 100 is about 50 μm, about 100 μm, about 200 μm, about 300 μm, about 400 μm, about 500 μm, about 600 μm, about 700 μm, about 800 μm, about 900 μm, about 1 mm, and any range using those values, such as within the range of 50 μm to 300 μm, and so on. In embodiments, the thickness 106 is within the range of 50 μm to 100 μm. The glass substrate 100 can have any desired shape. In embodiments, the glass substrate 100 has a circular shape. In those embodiments, the glass substrate 100 can have a diameter within the range of 200 mm to 300 mm. In other embodiments, the glass substrate 100 has a square or rectangular shape.

Figure 2:
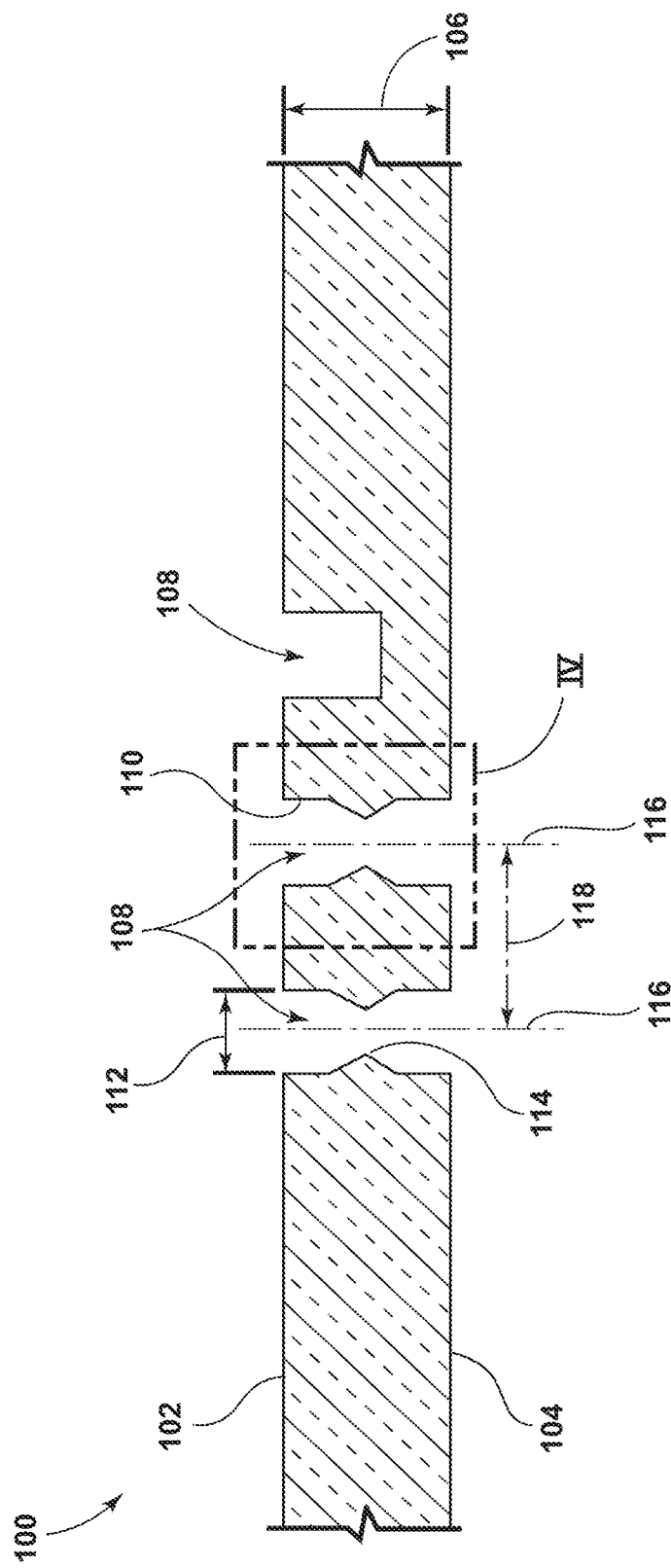
FIG. 2 is an elevational view of a cross-section taken along line II-II of FIG. 1, illustrating certain of the vias extending all the way through the thickness of the glass substrate and open at both the first surface and the second surface, and a sidewall surface defining each via.
Figure 3:
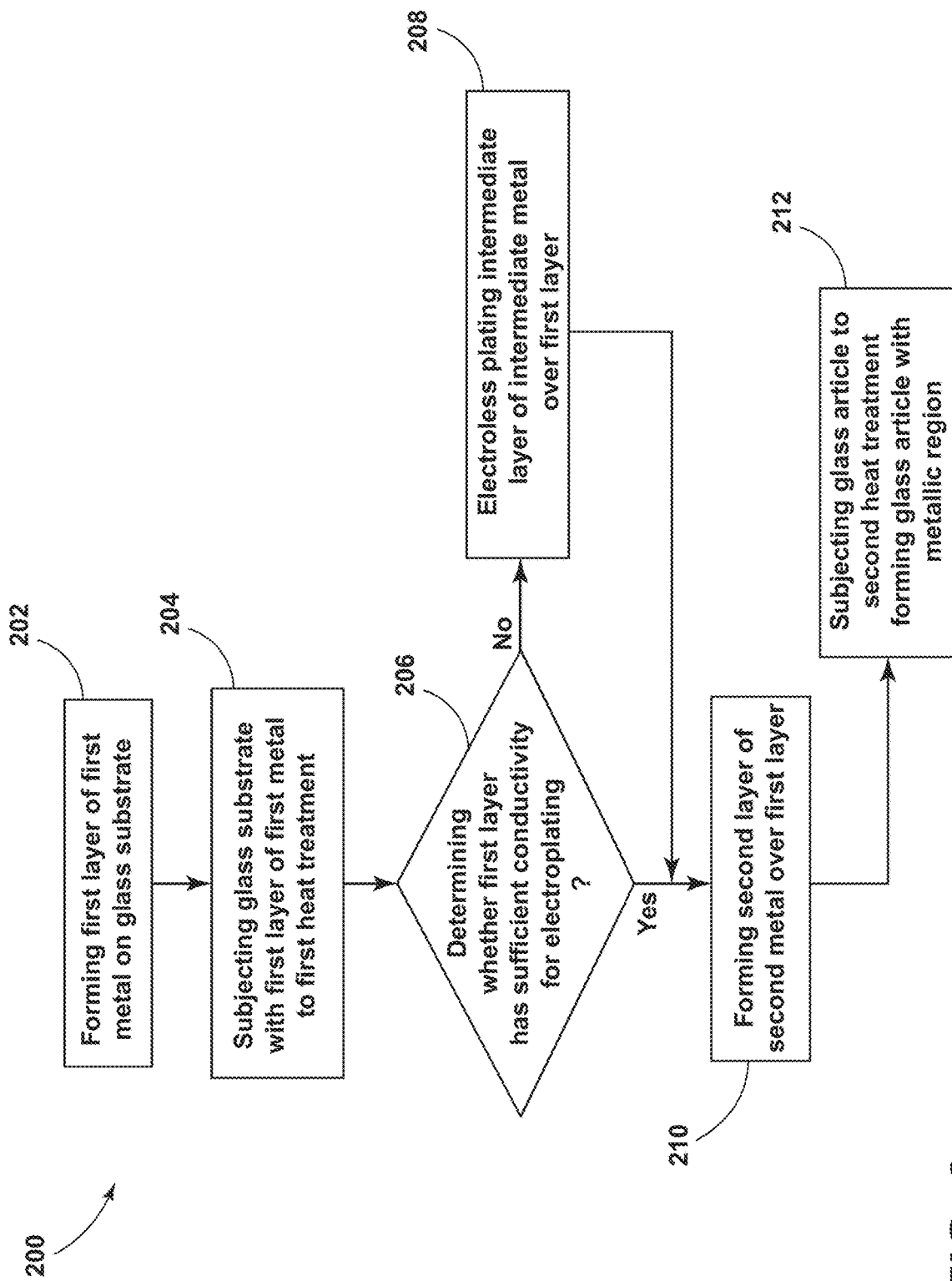
FIG. 3 is a flow diagram of a method of manufacturing a glass article from a glass substrate, such as the glass substrate of FIG. 1.
Figure 4:
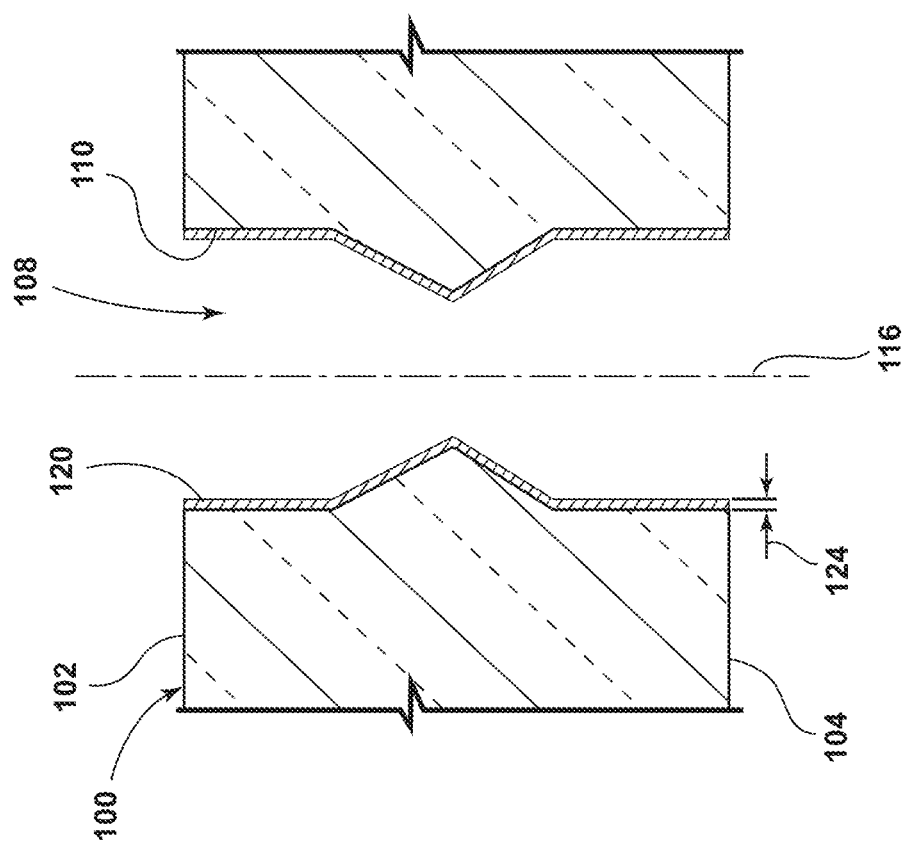
FIG. 4 is an elevational view of area IV of FIG. 2 after a step of the method of FIG. 3 of forming a first layer of a first metal on the glass substrate, particularly on a sidewall surface of the via.

Referring now additionally to FIG. 2, the glass substrate 100 further includes one or more vias 108. In embodiments, the glass substrate 100 includes a plurality of vias 108. In embodiments, some or all of the one or more vias 108 extend through the thickness 106 of the glass substrate 100 from the first surface 102 to the second surface 104. Such vias 108 may be referred to herein as "through vias." In other embodiments, some or all of the one or more vias 108 are open to the first surface 102 but extend only partially through the thickness 106, not extending all the way through the thickness 106 to the second surface 104. Such vias 108 may be referred to herein as "blind vias." In embodiments, the glass substrate 100 includes a plurality of both through vias and blind vias. A sidewall surface 110 defines each via 108 of the glass substrate 100.

Each via 108 has a diameter 112. Although the diameters 112 of each via 108 are shown as being the same, such need not be the case, i.e., the diameters 112 of the vias 108 may vary within the same glass substrate 100. In embodiments, the diameter 112 is within the range of from 5 μm to 150 μm. In embodiments, such as the illustrated embodiment, the vias 108 have an hourglass shape with a waist 114 where the diameter 112 of the via 108 is less than the diameter 112 of the via 108 at the first surface 102 and second surface 104 of the glass substrate 100. The hourglass shape may be conducive to electroplating, which is further described below. In other embodiments, the vias 108 have a substantially cylindrical or substantially conical shape.

Each via 108 has a central axis 116. The central axis 116 of one via 108 is separated from the central axis 116 of an adjacent via 108 by a distance referred to as a pitch 118. The pitch 118 can be any value according to the desired application, such as, without limitation, about 10 µm to about 2000 µm, including about 10 µm, about 25 µm, about 50 µm, about 100 µm, about 250 µm, about 500 µm, about 1000 µm, about 2000 µm, or any value or range between any two of these values (including endpoints). For example, the pitch 118 can be within the range of 10 µm to 100 µm, 25 µm to 500 µm, 10 µm to 1000 µm, or 250 µm to 2000 µm. The pitch 118 on the same glass substrate 100 can be variable or can be consistent. The pitch 118 can be such that there are from one (1) to twenty (20) vias 108 per square millimeter, for example. The number of vias per unit of area will depend upon the design and application of the interposer. In embodiments, the vias 108 are patterned throughout the glass substrate 100. In other embodiments, the vias 108 do not form a pattern.

The vias 108 are formed within the glass substrate 100 using one of a variety of forming techniques. For example, the vias 108 can be formed by mechanical drilling, etching, laser ablation, laser assisted processes, laser damage and etching processes, abrasive blasting, abrasive water jetting machining, concentrated electron-thermal energy, or any other suitable forming technique. In the laser damage and etching process, a damage track is initially formed in the glass substrate 100 by using a laser to modify the glass substrate 100 along the damage track. An etching solution is then applied to the glass substrate 100. The glass substrate 100 is thinned by the etching solution. Because the etching rate of the glass substrate 100 is faster at the damage track, the damage track is preferentially etched so that a via 108 is opened through the glass substrate 100.

Method 200 to Metalize the Glass Substrate 100

Referring now to FIGS. 3-8, the one or more vias 108 of the glass substrate 100 are metalized pursuant to a novel method 200 described herein. Although the method 200 is described in the context of the glass substrate 100 as an interposer and for the purpose of metalizing the vias 108, it should be understood that the method 200 concerns disposing metals onto the glass substrate 100 intended for any purpose, and concerns metalizing surfaces other than the sidewall surface 110 of the vias 108, such as the first surface 102, the second surface 104, and/or other apertures through or within the glass substrate 100. In the context of the glass substrate 100 for use as an interposer, as mentioned in the background, metalizing the vias 108 provides a conductive path through the interposer for electrical signals to pass from the first surface 102 to the second surface 104.

Forming First Layer 120 of a First Metal. At a step 202, the method 200 comprises forming a first layer 120 of a first metal on the glass substrate 100 (see particularly FIG. 4). In embodiments, the first layer 120 of the first metal may cover all or substantially all of the glass substrate 100. In embodiments, the first layer 120 of the first metal is a nano-layer having a thickness 124 within the range of 5 nm to about 10000 nm.

Alternatively, the first layer 120 of the first metal may be patterned to cover a portion of the glass substrate 100, such as a portion of the first surface 102, a portion of the second surface 104, a portion or an entirety of the sidewall surface 110 of the vias 108, or some combination thereof. In embodiments, the first metal comprises one or more of silver, palladium, platinum, ruthenium, nickel, cobalt, and gold. In embodiments, the first metal is or consists essentially of silver. In embodiments, the first layer 120 of the first metal is formed on the sidewall surface 110 of the vias 108. In embodiments, the first layer 120 of the first metal is or consists essentially of silver, and step 202 of the method 200 comprises forming the first layer 120 of the first metal (e.g., silver) on the sidewall surface 110 of the vias 108 of the glass substrate 100. Patterning may be done by selectively masking a region of the glass substrate 100 during the deposition of the first layer 120 of the first metal onto the glass substrate 100, such as with blocking tape or photoresist.

In embodiments, forming the first layer 120 of the first metal on the glass substrate 100 comprises contacting the glass substrate 100 with a suspension of nanoparticles of the first metal. To prepare the suspension of nanoparticles, the nanoparticles are dispersed in a liquid carrier. The liquid carrier can be water or solvent-based. The solvent-based liquid carrier can be a single solvent, a mixture of solvents, or a solvent (a single solvent or a mixture of solvents) having other non-solvent components. Exemplary solvents that can be utilized include, but are not limited to, a hydrocarbon, a halogenated hydrocarbon, an alcohol, an ether, a ketone, and like substances, or mixtures thereof, such as 2-propanol (also referred to as isopropanol, IPA, or isopropyl alcohol), tetrahydrofuran (THF), ethanol, chloroform, acetone, butanol, octanol, pentane, hexane, heptane, cyclohexane, and mixtures thereof.

The term "nanoparticle" refers to a particle/component with an average diameter (or cross-sectional dimension) along the shortest axis of between about 1 nm and about 10000 nm. It should be understood that particle sizes of nanoparticles can be distributional properties. Further, in some embodiments, the nanoparticles may have different sizes or distributions or more than one size or distribution. Thus, a particular size can refer to an average particle diameter which relates to the distribution of individual particle sizes. In some embodiments, the nanoparticles have an average diameter from about 5 nm to about 10000 nm, from about 5 nm to about 7500 nm, from about 5 nm to about 5000 nm, from about 5 nm to about 2500 nm, from about 5 nm to about 2000 nm, from about 5 nm to about 1500 nm, from about 5 nm to about 1250 nm, from about 5 nm to about 1000 nm, from about 5 nm to about 750 nm, from about 5 nm to about 500 nm, from about 5 nm to about 250 nm, from about 5 nm to about 200 nm, from about 5 nm to about 150 nm, from about 5 nm to about 125 nm, from about 5 nm to about 100 nm, from about 5 nm to about 75 nm, from about 5 nm to about 50 nm, from about 5 nm to about 25 nm, and from about 5 nm to about 20 nm, such as about 5 nm, 10 nm, 20 nm, 25 nm, 50 nm, 75 nm, 100 nm, 125 nm, 150 nm, 175 nm, 200 nm, 250 nm, 300 nm, 400 nm, 500 nm, 600 nm, 700 nm, 750 nm, 800 nm, 900 nm, 1000 nm, 1250 nm, 1500 nm, 2000 nm, 2500 nm, 5000 nm, 7500 nm, or 10000 nm. The size of the nanoparticles can be measured by a variety of methods such as dynamic light scattering techniques or with a transmission electron microscope (TEM). For example, as understood in the art, particle size distributions are often calculated via TEM image analysis of a sample consisting of hundreds of different nanoparticles.

Nanoparticles may have any shape and surface features. The structure and geometry of a nanoparticle can vary and the present disclosure is not intended to be limited to any particular geometry and/or structure. Embodiments herein comprise a plurality of nanoparticles and each individual nanoparticle or group of nanoparticles can have either the same or different structure and/or geometry than other nanoparticles. For example, in some embodiments, nanoparticles may be spherical, oblong, polyhedral, flakes, or take on crystalline-type structures. In some embodiments, nanoparticle surfaces may be smooth, rough, ordered, disordered, or patterned.

In embodiments, the nanoparticles of the first metal are nanoparticles of silver. In some embodiments, the nanoparticles of silver have an average diameter of 10 nm to 13 nm, and are dispersed in cyclohexane at a concentration of 20 percent by weight (commercially available from Cerion, LLC (Rochester, N.Y., USA)). Nanoparticles of copper were attempted but found to provide inadequate bonding to the glass substrate 100.

Before contacting the glass substrate 100 with the suspension of nanoparticles, the suspension of nanoparticles is optionally ultra-sonicated to promote dispersion of the nanoparticles throughout the liquid carrier. For example, the suspension of nanoparticles can be ultra-sonicated for a time period within the range of 15 minutes to 45 minutes, such as about 30 minutes.

When the glass substrate 100 is contacted with a suspension of nanoparticles of the first metal, the first layer 120 of the first metal may comprise less than a monolayer, a monolayer, or multiple layers of the nanoparticles of the first metal.

In embodiments, contacting the glass substrate 100 with a suspension of nanoparticles of the first metal comprises spin coating the glass substrate 100 with the suspension of nanoparticles. The spin coating can be performed at any speed and for any time period found adequate to form the desired first layer 120 of the first metal on the glass substrate 100. For example, the suspension of nanoparticles of the first metal can be deposited onto the glass substrate 100 rotating at 1000 to 5000 rpm (e.g., 1000, 2000, 3000, 4000, or 5000 rpm), for a time period of about 30 seconds, or less than 30 seconds, or more than 30 seconds.

In embodiments, contacting the glass substrate 100 with the suspension of nanoparticles of the first metal comprises dip-coating the glass substrate 100 in the suspension of nanoparticles of the first metal or spray coating the glass substrate 100 with the suspension of nanoparticles of the first metal. The dip-coating can be performed at a withdrawal speed (sometimes referred to as a pull rate) (e.g., 30 to 35 mm per minute) appropriate to form the first layer 120 of the first metal on the glass substrate 100.

In other embodiments, forming the first layer 120 of the first metal on the glass substrate 100 comprises electroless plating the first layer 120 of the first metal onto the glass substrate 100. In electroless plating, an ionic compound of a cation of the first metal and an anion is reduced to the first metal in elemental form by means of a chemical reducing agent. A typical electroless plating process includes: (a) a plating solution of the ionic compound including cations of the first metal; (b) a reducing agent; (c) a pH-adjusting agent; (d) a complexing agent to solubilize the ionic compound; and (e) special additives to control the solution stability and plating rate. These solutions are deposited on the glass substrate 100 with a catalytically active surface. This catalytically active surface catalyzes the reduction of the ionic compound and results in the deposition of the first metal in elemental form on the contacted surfaces of the glass substrate 100 (i.e., the first surface 102, the second surface 104, and/or the sidewall surface 110 of the vias 108). Deposits of the first metal on the surface(s) of the glass substrate 100 is autocatalytic and, thus, catalyzes further reaction and deposition of the first metal until the desired thickness 124 of the first layer 120 of the first metal is achieved.

As mentioned, the electroless plating process includes the plating solution including an ionic compound of a cation of the first metal, and a solvent. Suitable ionic compounds include, for example, silver nitrate, silver sulfate, palladium chloride, palladium acetate, platinum chloride, and gold cyanide. Typically, the ionic compounds are present in the plating solution at concentrations in the range of about 0.001 to about 10 weight percent based on the weight of the seeding solution. The solvent can be aqueous or it can be an organic liquid as appropriate for the ionic compound. Such organic liquids can include, for example, alcohols, ethers, ketones, alkanes, and the like.

As mentioned, the electroless plating process includes the reducing agent, the pH-adjusting agent, and the complexing agent. The reducing agent reduces cations of the first metal present on the glass substrate 100. Specific examples of the reducing agent include $NaBH_4$, $KBH_4$, $NaH_2PO_2$, hydrazine, formalin, and polysaccharides (e.g., glucose). The pH-adjusting agent adjusts the pH of the plating solution, and may be an acidic or basic compound. The complexing agent helps prevent precipitation of hydroxides in an alkaline solution and to control the concentration of free metal cations, thereby preventing the decomposition of the ionic compound and adjusting the plating speed. Specific examples of the complexing agent include ammonia solution, acetic acid, guanic acid, tartaric acid, chelating agents (e.g., ethylenediamine tetraacetic acid (EDTA)), and organic amine compounds.

In embodiments, the plating solution has a temperature of 30° C. to 50° C., such as about 40° C. In embodiments, the glass substrate 100 is subjected to the electroless plating process for a time period of 20 seconds to 5 minutes, such as about 30 seconds. In embodiments, the thickness 124 of the first layer 120 of the first metal deposited via electroless plating or otherwise is 10 nm to 100 nm, such as about 50 nm.

In still other embodiments, forming the first layer 120 of the catalyst metal on the glass substrate 100 comprises Langmuir-Blodgett deposition, electrospray ionization, direct nanoparticle deposition, vapor deposition, chemical deposition, vacuum filtration, flame spray, electrospray, spray deposition, electrodeposition, screen printing, close space sublimation, nano-imprint lithography, in situ growth, microwave assisted chemical vapor deposition, laser ablation, arc discharge, or chemical etching.

First Thermal Treatment of the First Layer 120 of the First Metal. At a step 204, the method 200 further comprises subjecting the glass substrate 100 with the first layer 120 of the first metal to a first thermal treatment. The first thermal treatment step 204 may be referred to herein as "sintering" the first layer 120 of the first metal deposited onto the glass substrate 100. As will be further elaborated upon below, it is believed that step 204 results in an intermixing of the first metal from the first layer 120, and at least one of aluminum, aluminum oxide, silicon, and silicon dioxide from the glass substrate 100, such that there is no sharply defined boundary between the first layer 120 of the first metal and the glass substrate 100.

If the first metal is susceptible to oxidation, then the step 204 can be performed in an inert atmosphere (e.g., nitrogen gas atmosphere) or, if not, a subsequent thermal treatment in a reducing atmosphere (e.g., hydrogen gas atmosphere) can be performed to reduce the oxidized first metal back to elemental form. An oxidized first metal can preclude deposition of subsequent metal(s) later in the method 200 (discussed below). Silver as the first metal is not prone to oxidize.

In embodiments, the first thermal treatment step 204 comprises subjecting the glass substrate 100 with the first layer 120 of the first metal to a temperature of 325° C. or greater. In embodiments, the first thermal treatment step 204 comprises subjecting the glass substrate 100 with the first layer 120 of the first metal to a temperature of 325° C. or greater for a time period of 45 minutes or longer. In embodiments, the first thermal treatment step 204 comprises subjecting the glass substrate 100 with the first layer 120 of the first metal to a temperature of 325° C. or greater for a time period of 45 minutes to 75 minutes. In embodiments, the first thermal treatment step 204 comprises subjecting the glass substrate 100 with the first layer 120 of the first metal to a temperature of 325° C. to 425° C. In embodiments, the first thermal treatment step 204 comprises subjecting the glass substrate 100 with the first layer 120 of the first metal to a temperature of 325° C. to 425° C. for a time period of 45 minutes to 75 minutes. In embodiments, the glass substrate 100 is initially at a temperature below 325° C. (such as room temperature) and then subjected to increasing temperature at a certain ramp up rate (such as a ramp up rate within the range of 0.5° C. per minute to 10° C. per minute) to the desired temperature of 325° C. or greater. In other embodiments, the glass substrate 100 with first layer 120 of the first metal is placed directly into a pre-heated furnace set to a pre-determined temperature within the operable range of the first thermal treatment step 204. This step 204 can be performed by placing the glass substrate 100 with the first layer 120 of the first metal in a vertical furnace, a tube furnace, a rapid thermal annealer (RTA), on a hot-plate, and so on.

In embodiments, the first thermal treatment step 204 comprises subjecting the glass substrate 100 with the first layer 120 of the first metal to a first temperature of 325° C. to 375° C. for a first time period, and subsequently a second temperature of 375° C. to 425° C. for a second time period that is longer than the first time period. The first time period can be within the range of 1 minute to 5 minutes. The second time period can be such that the total of the first time period and the second time period is between 45 minutes and 75 minutes. For example, the glass substrate 100 with the first layer 120 of the first metal can be initially subjected to a first temperature of 350° C. for 2 minutes, and subsequently subjected to a second temperature of 400° C. for 60 minutes. Subjecting the glass substrate 100 with the first layer 120 of the first metal to the first temperature for the first time period within the range of 1 minute to 5 minutes, without subsequently subjecting the glass substrate 100 to the second temperature for the second time period, resulted in inadequate adhesion of the first layer 120 of the metal to the glass substrate 100.

Determining that First Metal Region Has Sufficient Conductivity. At a step 206, the method 200 optionally comprises determining that the first layer 120 of the first metal has (a) a conductivity that is less than a predetermined conductivity or (b) a resistivity that is higher than a predetermined resistivity. The point of this step 206 is to determine whether a second layer 128 of a second metal can be electroplated over the first layer 120 (such as to fully metalize the vias 108 of the glass substrate 100 intended to be an interposer). Resistivity can be determined with a multimeter, such as the Fluke 87-V (Fluke Corporation, Everett, Wash., USA), or using a non-contact surface resistivity measuring instrument, such as those manufactured by NAGY Messsysteme GmbH (Gäufelden, Germany). Conductivity is the inverse of resistivity. Because the first thermal treatment step 204 causes intermixing of the first metal and silicon (or silicon dioxide) and/or aluminum (or aluminum oxide), the conductivity of first layer 120 may be diminished relative to conductivity of the first metal. The predetermined conductivity is a conductivity operable for electroplating of the second layer 128 of the second metal in a subsequent step of the method 200, as further described below, and will vary with the selection of the second metal for the second layer 128. For typical metal(s) to be used as the second metal of the second layer 128, the predetermined conductivity/resistivity correlates to a sheet resistance of 100 Ω/□.

Figure 5:
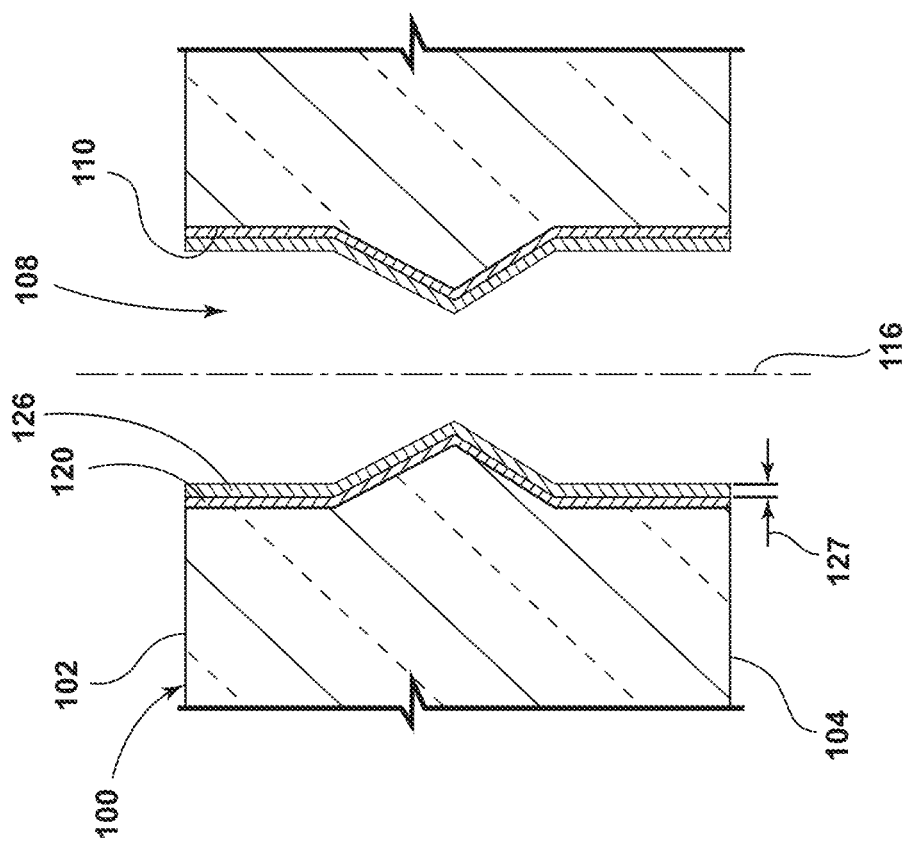
FIG. 5 is the same view as FIG. 4 but after a step of the method of FIG. 3 of electroless plating an intermediate layer of an intermediate metal over the first layer of the first metal.
Figure 6:
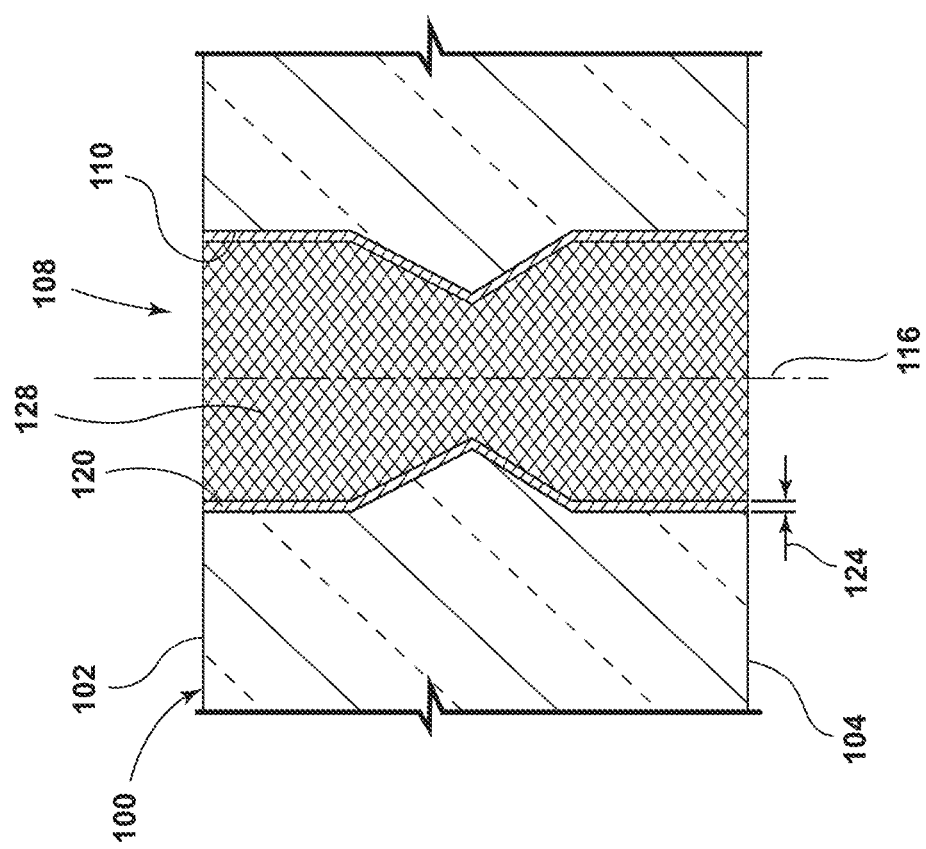
FIG. 6 is the same view as FIG. 5 but after a step of the method of FIG. 3 of forming a second layer of a second metal over the first layer of the first metal.
Figure 7:
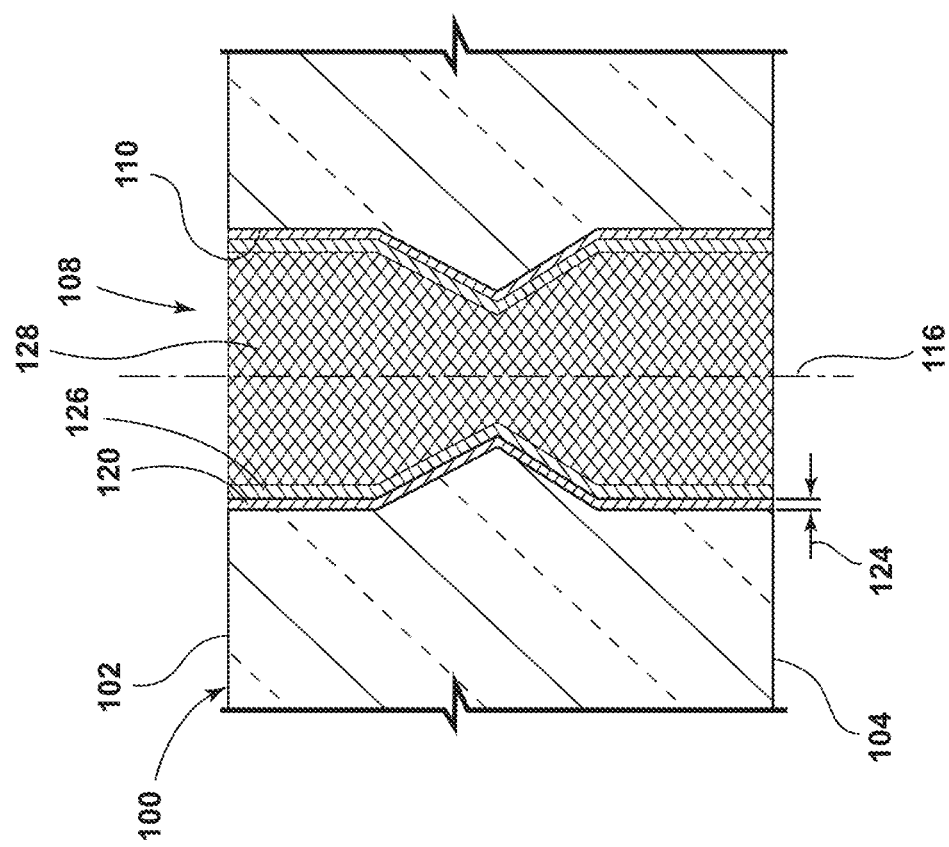
FIG. 7 is the same view as FIG. 5 but after a step of the method of FIG. 3 of forming the second layer of the second metal onto the intermediate layer of the intermediate metal.
Figure 8:
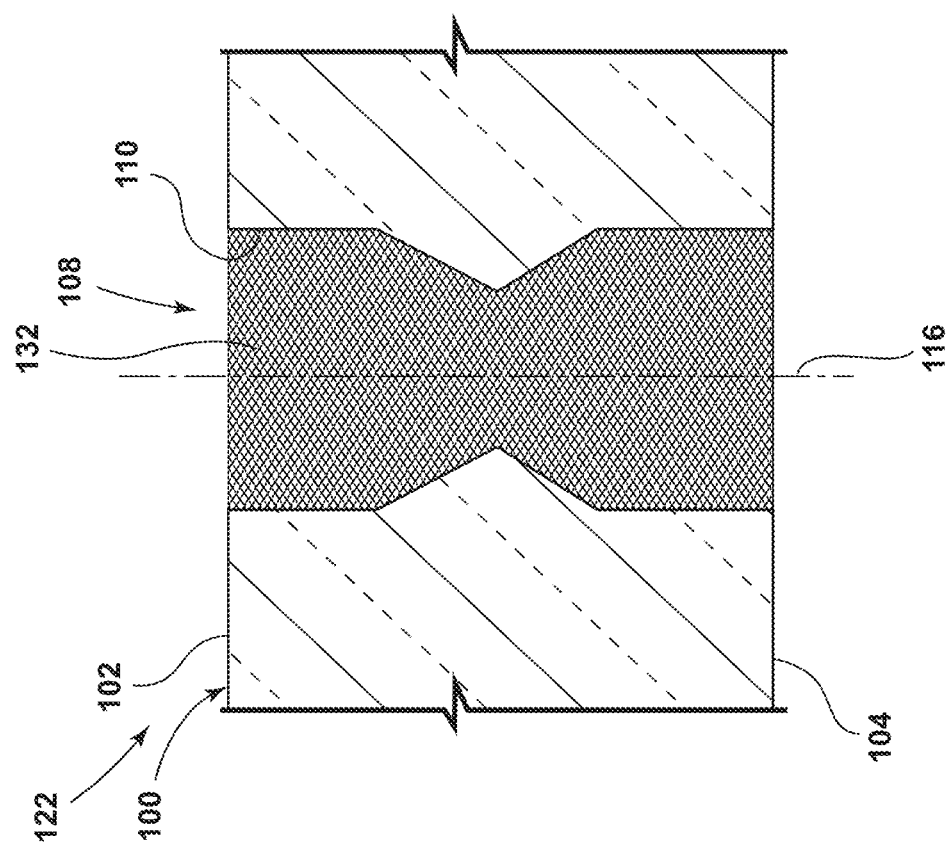
FIG. 8 is the same view as FIGS. 6 and 7 but after a step of the method of FIG. 3 of subjecting the second layer to a thermal treatment resulting in a glass article comprising a metallic region that includes the first metal, the second metal, the intermediate metal if the intermediate layer was added, aluminum oxide, and silicon dioxide.

If it is determined that the first layer 120 has either (a) conductivity that is less than the predetermined conductivity or (b) resistivity that is higher than the predetermined resistivity, then the method 200 at a step 208 further comprises electroless plating an intermediate layer 126 of an intermediate metal over the first layer 120 of the first metal (see particularly FIG. 5). In embodiments, the intermediate metal of the intermediate layer 126 is or consists essentially of copper. In embodiments, the intermediate metal comprises one or more of silver, gold, cobalt, cobalt-phosphorous, copper, nickel, and nickel-phosphorous. Electroless plating is detailed above. The intermediate layer 126 of the intermediate metal applied over the first layer 120 permits subsequent electroplating of the second layer 128 of the second metal onto the intermediate layer 126, should the first layer 120 have insufficient conductivity (too much resistivity). In embodiments, the intermediate layer 126 has a thickness 127 within the range of 10 nm to 100 nm. In some embodiments, step 208 is performed to add the intermediate layer 126 without performing step 206 or without regard to the conductivity or resistivity of the first layer 120.

Forming Second Layer 128 of the Second Metal on the First Layer 120. At a step 210, the method 200 further comprises forming a second layer 128 of a second metal over the first layer 120 (see particularly FIG. 6). Step 210 occurs after step 206 or step 208, in the event that it was determined that the first layer 120 was insufficiently conductive to accept electroplating of the second layer 128 of the second metal. In embodiments where the glass substrate 100 is intended to be manufactured into an interposer, then the second layer 128 of the second metal fills the remaining open portions of the vias 108. The vias 108 have thus become fully metalized (i.e., filled) with metal. In embodiments, the second metal is one or more of copper, silver, aluminum, titanium, gold, platinum, nickel, tungsten, lead, manganese, and magnesium. In embodiments, the second metal is an alloy of copper and manganese. In embodiments, the second metal is copper and the first metal (of the first layer 120) is silver. In embodiments, the second metal is an alloy of copper and manganese, and the first metal is silver. In embodiments, the step 210 of the method 200 comprises electroplating the second layer 128 of copper as the second metal over the first layer 120 of silver to fully metalize the one or more vias 108.

In embodiments, forming the second layer 128 of the second metal onto the first layer 120 comprises electroplating the second layer 128 of the second metal over the first layer 120. If at step 206 it was determined that the first layer 120 has sufficient conductivity (or not too much resistivity), then at step 210, the second layer 128 of the second metal is electroplated directly onto the first layer 120. If at step 206 it was determined that the first layer 120 was insufficiently conductive or too resistive and the intermediate layer 126 of the intermediate metal was disposed onto the first layer 120 of the first metal, then at step 210, the second layer 128 of the second metal is electroplated onto the intermediate layer 126 of the intermediate metal (see particularly FIG. 7) and thusly over the first layer 120 but with the intermediate layer 126 of the intermediate metal disposed between the first layer 120 and the electroplated second layer 128 of the metal.

In electroplating, the glass article 122 is placed in a plating solution, which contains an ionic compound having the cation of the second metal desired to form the second layer 128 and an anion, and a current is applied. As a result, the second metal in elemental form is applied over the first layer 120 of the first metal or the intermediate layer 126 of the intermediate metal, as the case may be, forming the second layer 128 of the second metal. The anion of the ionic compound containing the cation of the second metal to be deposited includes sulfate, nitrate, and chloride anions. An example ionic compound is copper sulfate. An example plating solution includes copper sulfate pentahydrate ($CuSO_4 \cdot 5H_2O$), potassium pyrophosphate ($K_4P_2O_7$), and citric acid in distilled water. Another example plating solution includes copper sulfate pentahydrate ($CuSO_4 \cdot 5H_2O$), manganese sulfate monohydrate ($MnSO_4 \cdot H_2O$), potassium sodium tartrate tetrahydrate (Rochelle salt), and formaldehyde. In embodiments, the concentration of the ionic compound in the plating solution is 0.001M or greater. In addition to the glass article 122, an electrode fabricated from any electrically conductive material is also disposed in the plating solution. In embodiments, the plating solution has a temperature between 10° C. and 50° C., such as room temperature or 40° C.

Current, voltage, or a combination thereof is applied between the electrode and the glass substrate 100 with the first layer 120 (and intermediate layer 126 if present) to provide a negative constant current to the glass substrate 100 with the first layer 120 (and intermediate layer 126 if present). In embodiments, a current density range of about 0.001 $mA/cm^2$ to about 1 $A/cm^2$ and a voltage range of about −0.001 V to about −20 V is provided. As a result, the cations of the second metal intended to be the second layer 128 are reduced in elemental form over the first layer 120 (or over the intermediate layer 126, as the case may be). The current density controls the rate of this reduction reaction. Thus, the deposition rate may be increased or decreased by increasing or decreasing the applied current. However, it is noted that too high of an applied current may result in a porous and void filled deposit, and too low a current may render the process too long to be practically useful. After the desired second layer 128 of the second metal is applied over the first layer 120 (or the intermediate layer 126 if present), the current is stopped, the glass substrate 100 is removed from the plating solution, and the glass substrate 100 with the second layer 128 can be cleaned with deionized water. The glass substrate 100 with the second layer 128 now may optionally be dried, such as by flowing a stream of nitrogen thereupon.

In other embodiments, forming the second layer 128 of the second metal onto the metallic region 132 comprises electroless plating, chemical vapor deposition (CVD), or physical vapor deposition (PVD) which includes sputtering, and thermal and e-beam evaporation methods. The CVD process is suited for vias 108 of a relatively small size (3-5 μm in diameter 112) with aspect ratios up to 20, but may not be suitable for vias 108 that are larger and deeper. ALD (atomic layer deposition) is a method that can be used to fill vias 108 of a high aspect ratio.

In embodiments where the glass substrate 100 is manufactured into an interposer, the second layer 128 of the second metal fills the remaining open portions of the vias 108. When the second layer 128 is added via electroplating, the glass substrate 100 is disposed in the plating solution such that the plating solution fills all of the vias 108. The second layer 128 of the second metal is deposited on the first layer 120 (or the intermediate layer 126 if present) and continuously built up until the via 108 is hermetically sealed and thus fully metalized. In embodiments where the via 108 takes an hourglass shape, the narrower waist 114 provides a metal "bridge" for the electrically conductive second metal to be initially deposited. The second metal is continuously deposited on both sides of this bridge until the second layer 128 is formed and the via 108 is filled. The "bridge" helps prevent deposition of the second metal near the first surface 102 or the second surface 104 that closes off the interior of the via 108 before it is filled with the second metal. Such closing off of the interior of the via 108 forms voids within the vias 108. Once the second layer 128 of the second metal has filled the vias 108 of the glass substrate 100, the current is stopped and the glass substrate 100 is separated from the plating solution.

Second Thermal Treatment of the Glass Article 122 with the Second Layer 128. At a step 212, the method 200 further comprises subjecting the glass substrate 100 with the second layer 128 of the second metal to a second thermal treatment. The first thermal treatment step 204 and the second thermal treatment step 212 induces intermixing of the first metal, the second metal, and at least one of aluminum, aluminum oxide, silicon, and silicon dioxide of the glass substrate 100 to form a glass article 122 with a metallic region 132 (see FIG. 8) comprising the first metal, the second metal, aluminum oxide, and silicon dioxide. The metallic region 132 comprises the first metal from the first layer 120, the second metal from the second layer 128, the intermediate metal from the intermediate layer 126 (if applied) and additionally constituents from the glass substrate 100, such as aluminum (or aluminum oxide) and silicon (or silicon dioxide). In other words, it is believed that the first metal from the first layer 120 and aluminum (or aluminum oxide) and silicon (or silicon dioxide) from the glass substrate 100 intermix during step 204. Further, it is believed that the second metal from the second layer 128, the first metal from the first layer 120, the intermediate metal from the intermediate layer 126 (if present) and aluminum (or aluminum oxide) and silicon (or silicon dioxide) from the glass substrate 100 intermix during step 212. The metallic region 132 thus includes the first metal from the first layer 120, the second metal from the second layer 128, and the intermediate metal from the intermediate layer 126 (if present), as well as aluminum, silicon, and oxygen. At least a portion of the aluminum and silicon form an oxide phase in the metallic region 132. The oxide phase includes aluminum oxide and silicon dioxide. The oxygen in the oxide phase may diffuse or migrate from the glass substrate 100 during steps 204 and 212 or enter the metallic region 132 from the surrounding environment (e.g., air). Irrespective of the source of oxygen, the net result is formation of the metallic region 132 that includes aluminum oxide and silicon dioxide. While not wishing to be bound by theory, it is believed that the presence of aluminum oxide and/or silicon dioxide in the metallic region 132 improves adhesion of the applied first metal, second metal, and intermediate metal (if applied) to the glass substrate 100.

In embodiments, the second thermal treatment comprises subjecting the glass substrate 100 with the second layer 128 of the second metal to a temperature of at least 300° C. for a time period of at least 20 minutes. In embodiments, the second thermal treatment comprises subjecting the glass substrate 100 with the second layer 128 of the second metal to a temperature of 300° C. to 400° C. for a time period of at least 20 minutes. In embodiments, the second thermal treatment comprises subjecting the glass substrate 100 with the second layer 128 of the second metal to a temperature of 300° C. to the strain point of the glass substrate 100, including 300° C. to 400° C., such as 325° C. to 375° C., for a time period of at least 20 minutes, such as 20 minutes to 8 hours. In embodiments where the glass substrate 100 is to be an interposer, the step 212 comprises subjecting the glass interposer to a temperature of 300° C. to the strain point of the glass substrate 100, including 300° C. to 400° C., such as 325° C. to 375° C., for a time period of at least 20 minutes.

One purpose of step 212 is to intermix the first metal, the second metal, the intermediate metal (if present), as well as silicon (or silicon dioxide) and aluminum (or aluminum oxide) from the glass substrate 100, as explained above. While temperatures below 300° C. may satisfy that purpose, such temperatures may require a time that is unreasonably long for commercial purposes. In other words, temperature of below 300° C. for step 212 may result in such intermixing but would likely take too long of a time period to be commercially practical. A temperature of 400° C. or less for step 212 will be compatible with most glass substrates 100. Another purpose of step 212 is to relieve stresses that have developed in the glass substrate 100. For example, a laser process used to form the vias 108 in the glass substrate 100 intended to be used as an interposer can generate thermal stresses within the glass substrate 100. The annealing of the glass substrate 100 after metallizing the vias 108 relieves residual stresses that may be present.

In embodiments, the glass substrate 100 with the second layer 128 is disposed in a heating apparatus at room temperature and then the temperature within the heating apparatus is raised to the temperature between 300° C. and 400° C. (or a higher or lower temperature compatible with the glass substrate 100 and available process time) at a predetermined rate. For example, the predetermined rate can be within the range of 1° C. per minute to 11° C. per minute. The temperature within the heating apparatus is then maintained for the time period. After the time period, the temperature within the heating apparatus is cooled to room temperature at any rate that does not cause thermal cracking of the glass substrate 100, such as at a rate within the range of −0.6° C. per minute to −2.0° C. per minute. Example heating apparatuses appropriate for this step 212 include an annealing furnace, an annealing oven (such as those available under the Blue M brand available from Thermal Product Solutions, New Columbia, Pa., USA), a forced draft furnace (e.g., Fisher Isotemp Programmable Forced-Draft furnace from Fisher Scientific, Waltham, Mass., USA). The glass substrate 100 with the second layer 128 can be annealed in nitrogen.

Glass Article 122 Comprising Glass Substrate 100 Bulk Composition and Metallic Region 132

Figure 9:
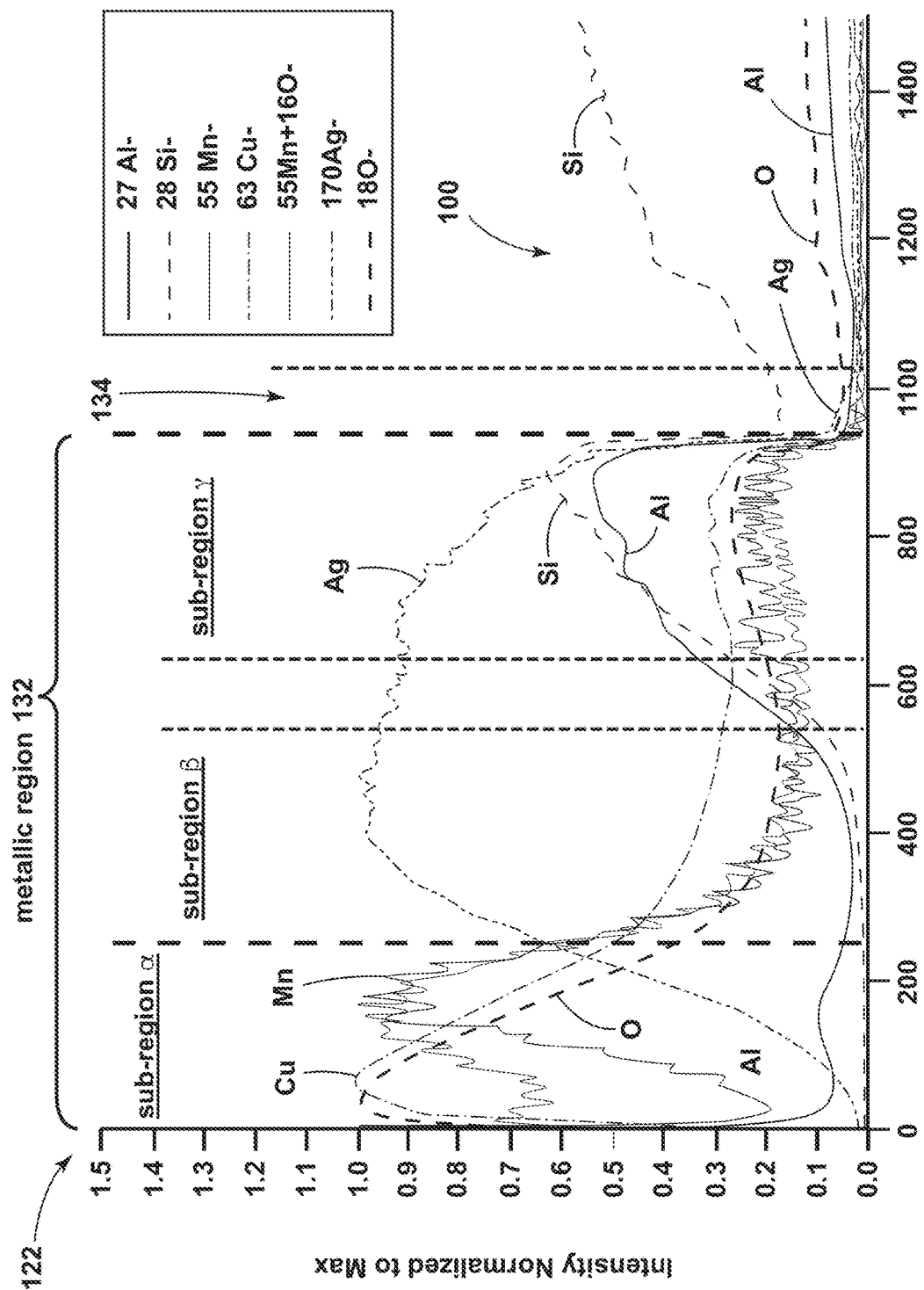
FIG. 9 is a graph of relative weight percentage of individual chemical elements within the glass article manufactured via the method of FIG. 3 as a function of position within the glass article, illustrating (i) the glass substrate comprising predominately silicon dioxide and aluminum oxide, (ii) a sub-region α of the metallic region that comprises predominantly (by weight percentage) the second metal, (iii) a sub-region β that comprises predominately (by weight percentage) the first metal, more of the second metal than silicon dioxide, and more of the second metal than aluminum oxide, and (iv) a sub-region γ that comprises predominantly, by weight percentage, the first metal, more silicon dioxide than the second metal, and more aluminum oxide than the second metal.

Referring now to FIG. 9, as described above, subjecting the glass substrate 100 with the first metal and the second metal to the elevated temperature for the time period during step 212 results in substantial intermixing of the first metal, the second metal, the intermediate metal (if applied), and constituents of the glass substrate 100, including silicon (or silicon dioxide) and aluminum (or aluminum oxide). This is illustrated particularly at FIG. 9, where the composition of an example glass article 122 made pursuant to the method 200 varies as a function of position within the glass article 122. The glass substrate 100 comprises predominantly, by weight percentage, silicon dioxide and aluminum oxide, as discussed above. However, note that the weight percentages of both silicon dioxide and aluminum oxide fall as the position within the glass substrate 100 moves toward the metallic region 132. The time of 0 on the x-axis of FIG. 11 can represent a primary surface of a planar glass article 122 where the metallic region 132 is open to the environment. In addition, the time of 0 on the x-axis of FIG. 9 can represent the central axis 116 of the metalized via 108, and increases in time along the x-axis represent positions laterally further away from the central axis 116. In addition, note that the x-axis is in units of time because it is a sputtering process and so the x-axis is time of sputtering. The longer the sputtering time the deeper the measurement of composition into a sample. Thus, the plotted time is indicative of depth into the glass article 122. However, the time values cannot be readily converted into depth easily because different materials have different sputtering rates.

The metallic region 132 comprises the first metal (in this particular instance Ag) and the second metal (in this particular instance Cu and Mn). The metallic region 132 further includes silicon dioxide and aluminum oxide. In embodiments, the aluminum oxide is contiguous throughout the metallic region 132. Within the metallic region 132, there is a sub-region α that comprises predominantly (by weight percentage) the second metal. That is, there is (i) a greater weight percentage of the second metal in the sub-region α than the first metal, (ii) a greater weight percentage of the second metal in the sub-region α than silicon dioxide, and (iii) a greater weight percentage of the second metal in the sub-region α than aluminum oxide.

In addition, within the metallic region 132, there is a sub-region β that comprises predominately (by weight percentage) the first metal, more of the second metal than silicon dioxide, and more of the second metal than aluminum oxide. There is (i) a greater weight percentage of the first metal than the second metal, (ii) a greater weight percentage of the first metal than silicon dioxide, and (iii) a greater weight percentage of the first metal than aluminum oxide. The weight percentage of the second metal is greater than the weight percentage of silicon dioxide. The weight percentage of the second metal is greater than the weight percentage of aluminum oxide.

Finally, within the metallic region 132, there is a sub-region γ that comprises predominantly, by weight percentage, the first metal, more silicon dioxide than the second metal, and more aluminum oxide than the second metal. There is (i) a greater weight percentage of the first metal than the second metal, (ii) a greater weight percentage of the first metal than silicon dioxide, and (iii) a greater weight percentage of the first metal than aluminum oxide. The weight percentage of silicon dioxide is greater than the weight percentage of the second metal. The weight percentage of aluminum oxide is greater than the weight percentage of the second metal.

Silicon (or silicon dioxide) and aluminum (or aluminum oxide) migrate from the glass substrate 100 and into the metallic region 132 during the thermal treatment steps 204 and 212 joining the first metal and the second metal. A portion of the first metal from the first layer 120 migrates to join a portion of the second metal from the second layer 128 to form the sub-region α during the second thermal treatment step 212. A portion of the second metal from the second layer 128 migrates to join a portion of the first metal from the first layer 120 to form the sub-region β and the sub-region γ during the second thermal treatment step 212.

In embodiments of the method 200 that included the step 208 of adding the intermediate layer 126 of the intermediate metal, then the metallic region 132 may further comprise the intermediate metal.

Of the sub-region α, the sub-region β, and the sub-region γ, the sub-region γ is closest to the glass substrate 100 and the sub-region α is furthest from the glass substrate 100.

In embodiments, the glass article 122 further comprises a transitory region 134 disposed between the glass substrate 100 and the metallic region 132. The transitory region 134 comprises, by weight percentage, predominantly silicon dioxide but more of the first metal than aluminum oxide. In embodiments, the transitory region 134 is disposed between the bulk of the glass substrate 100 and the sub-region γ of the metallic region 132.

In embodiments where the glass article 122 is an interposer, the vias 108 are completely metalized and the vias 108 comprise the metallic region 132. The sub-region α comprising predominately the second metal is centered around the central axis 116 of each via 108. When the vias 108 are filled and fully metalized with the metallic region 132, the vias 108 can electrically connect electrical traces of electrical components disposed on the first surface 102 and the second surface 104 of the glass article 122.

This substantial intermixing of the first metal, the intermediate metal (if present), the second metal, and constituents of the glass substrate 100, including silicon (or silicon dioxide) and aluminum (or aluminum oxide) results in strong bonding of the second metal to the glass substrate 100 (via the formation of the metallic region 132). The degree of bonding is a surprising result, considering that the method 200 does not require that the surfaces of the glass substrate 100 over which the second metal is to be applied be "roughened" either through additive or subtractive processes. Such a roughening step, where the surface roughness of the target surfaces of the glass substrate 100 are increased, is typically utilized. The increase in surface roughness provides structural features at the surface to which the metals can physically bond. The method 200, not requiring such roughening steps, is more cost-effective. In embodiments, the surface(s) of the glass substrate 100 to which the first layer 120 of the first metal is applied has a surface roughness ($R_a$) of 1 to 3 nm.

EXAMPLES

Example 1. In Example 1, a glass substrate 100 was selected. The glass substrate 100 was Eagle XG® available from Corning Incorporated (Corning, N.Y., USA). This glass substrate 100 was an alkali-free aluminoborosilicate glass substrate, the major components of which included silicon dioxide, aluminum oxide, calcium oxide, and magnesium oxide. More specifically, the glass substrate 100 comprised (on an oxide basis): 64.0 to 71.0 mol % $SiO_2$; 9.0 to 12.0 mol % $Al_2O_3$; 7.0 to 12.0 mol % $B_2O_3$; 1.0 to 3.0 mol % MgO; 6.0 to 11.5 mol % CaO; 0 to 2.0 mol % SrO; 0 to 0.1 mol % BaO; and at least 0.01 mole percent $SnO_2$; wherein, $1.00 \leq \Sigma[RO]/[Al_2O_3] \leq 1.25$, where $[Al_2O_3]$ is the mole percent of $Al_2O_3$ and $\Sigma[RO]$ equals the sum of the mole percents of MgO, CaO, SrO, and BaO. The glass substrate 100 had the first and second surfaces 102, 104 that were substantially parallel and flat. The glass substrate 100 did not have vias 108.

A suspension of nanoparticles of silver was obtained to form the first layer 120 of silver as the first metal. The nanoparticles of silver had an average diameter of 10 nm to 13 nm, and were dispersed in cyclohexane at a concentration of 20 percent by weight. The suspension of nanoparticles of silver was ultra-sonicated for a time period of 30 minutes. The ultra-sonication broke up agglomerations of the nanoparticles of silver, and thereby improved dispersion of the nanoparticles of silver throughout the liquid carrier.

Step 202 of the method 200 was then performed, forming a first layer 120 of silver as the first metal onto the first surface 102 of the glass substrate 100. More particularly, the glass substrate 100 was contacted with the suspension of nanoparticles of silver. Specifically, the suspension of nanoparticles of silver was spin coated onto the glass substrate 100 thus forming the first layer 120 of silver as the first metal onto the glass substrate 100. The speed of the spinning of the glass substrate 100 was 1000 rpm.

Step 204 of the method 200, a first thermal treatment, was then performed. More particularly, the glass substrate 100 with the first layer 120 of silver as the first metal was placed onto a hot plate having a temperature of 350° C. for 2 minutes. Subsequently, the glass substrate 100 with the first layer 120 of silver as the first metal was placed into a furnace having an air temperature of 350° C. The furnace increased the temperature of the air to 400° C. increments of 1° C. per minute. The glass substrate 100 with the first layer 120 of silver as the first metal was in the furnace for a time period of 1 hour.

Step 206 of the method 200 was then performed. More particularly, the sheet resistance of the first layer 120 was measured with a Fluke 87-A multimeter. The sheet resistance was 0.7Ω/□. It was determined from this value that the first layer 120 was not too resistive (i.e., was sufficiently conductive) to accept electroplating of a second layer 128 of a second metal pursuant to the subsequent step 210.

Step 210 of the method 200 was then performed, and a second layer 128 of an alloy of copper and manganese as the second metal was formed over the first layer 120 of silver as the first metal. More particularly, a plating solution of copper sulfate and manganese sulfate (1M concentration) dissolved in deionized water was prepared. The glass substrate 100 including the first layer 120 of silver as the first metal was placed in the plating solution and electroplated, using a copper plate as the electrode. A current of 50 mA was applied for a time period of 1 hour. A 2.5 μm thick second layer 128 of an alloy of copper as the second metal was electroplated over the first layer 120.

Step 212 of the method 200, a second thermal treatment, was then performed. More particularly, the glass substrate 100 with the first layer 120 of silver as the first metal and the second layer 128 of an alloy of copper and manganese as the second metal was annealed in a vacuum oven. The glass substrate 100 was placed into the vacuum oven providing an environment at room temperature. The vacuum oven then raised the internal temperature to which the glass substrate 100 was subjected from room temperature to 350° C. in increments of 5° C. per minute. The glass substrate 100 was then subjected to the temperature of 350° C. for 30 minutes. The glass substrate 100 was then cooled to room temperature at a rate of −5° C. per minute.

The second thermal treatment of the glass substrate 100 with the first layer 120 of silver as the first metal and the second layer 128 of an alloy of copper and manganese as the second metal (at step 212) resulted in the glass article 122 as described above in connection with FIG. 9, with substantial blending of the silver as the first metal, copper and manganese as the second metal, and both silicon and aluminum from the glass substrate 100 in oxide form throughout the metallic region 132. In particular, the glass substrate 100 has predominantly silicon dioxide and aluminum oxide, with the relative amounts of both silicon dioxide and aluminum oxide decreasing as position within the glass substrate 100 changes towards the metallic region 132. Sub-region β and sub-region δ of the metallic region 132 comprise predominantly silver from the first layer 120. Between the glass substrate 100 and the metallic region 132 is the transitory region 134 comprising predominately silicon dioxide but more of silver from the first layer 120 than aluminum oxide.

Sub-region β and sub-region δ of the metallic region 132 has predominantly silver from the first layer 120 but also comprises the copper and manganese that migrated from the second layer 128 throughout. The relative amount of silicon dioxide and aluminum oxide generally decreases throughout sub-region β and sub-region δ towards sub-region α. In sub-region δ, the weight percentage of silicon dioxide and aluminum oxide each exceed the weight percentage of copper and manganese from the second layer 128.

Sub-region α of the metallic region 132 comprises predominately copper and manganese from the second layer 128. In sub-region α of the metallic region 132, the weight percentage of copper and manganese from the second layer 128 is greater than the weight percentage of silicon dioxide and greater than the weight percentage of aluminum oxide. The presence of aluminum oxide in sub-region α is surprising because it means that aluminum or aluminum oxide has migrated from the glass substrate 100 to the sub-region α during the first and second thermal treatment steps 204, 212. Sub-region α additionally comprises the silver from the first layer 120.

The generation of the transitory region 134 where silver from the first layer 120 appears to enter into the glass network, and the migration of aluminum or aluminum oxide throughout the metallic region 132, provides a strong bond between the metallic region 132 and the glass substrate 100, allowing the metallic region 132, which includes copper and manganese as the second metal, to strongly bond to the silver added as the first layer 120 and the glass substrate 100.

Figure 10:
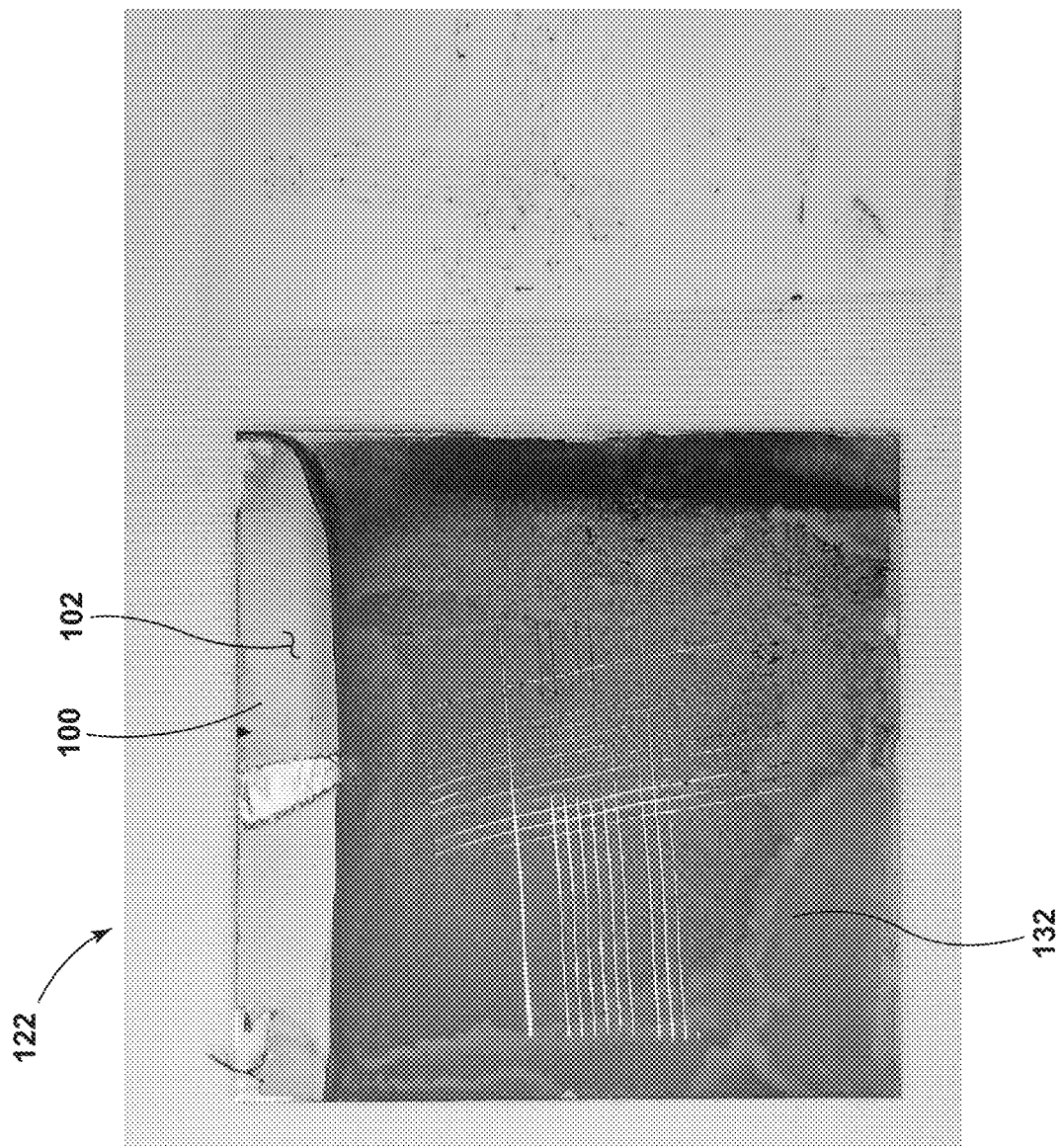
FIG. 10 is a picture of an example of a glass article manufactured according to the method of FIG. 3, illustrating that the metallic region bonded well to the glass substrate with no pieces of metal being separated from the glass substrate during a tape pull test.

Referring now to FIG. 10, a cross-hatch tape test was performed on the resulting glass article 122 pursuant to ASTM D3359-09 (Standard Test Methods for Measuring Adhesion by Tape Test), to test the bonding (adhesion) of the metallic region 132 to the glass substrate 100. For the tape test, a lattice pattern with eleven cuts in each direction is made into the metallic region 132. Pressure-sensitive tape is then applied over the lattice pattern. The tape is then peeled off. The amount and type of removal is then compared to descriptions and illustrations in the ASTM documentation. The peeling of the tape removed 0% of the metallic region 132 from the glass article 122. In terms of the ASTM standard, the test result was 5B. This shows a high level of bonding of the silver (added as the first layer 120) and copper and manganese (added as the second layer 128) to the glass substrate 100.

Example 2. In Example 2, a glass substrate 100 was selected. The glass substrate 100 was again Eagle XG® available Corning Incorporated (Corning, N.Y., USA) and otherwise the same as the glass substrate 100 of Example 1. With the exception of step 210, the glass substrate 100 of Example 2 was subjected to the same method 200 as the glass substrate 100 of Example 1. At step 210, for Example 2, a non-acidic plating solution of copper sulfate (1M concentration) dissolved in deionized water was prepared. Plating solutions for copper can further include hydrosulfuric acid, but for step 210 has proven to be unnecessary. The glass substrate 100 including the first layer 120 of silver as the first metal was placed in the plating solution and electroplated, using a copper plate as the electrode. A current of 50 mA was applied for a time period of 1 hour. A 2.5 μm thick second layer 128 of copper as the second metal was electroplated over the first layer 120 of silver.

Figure 11:
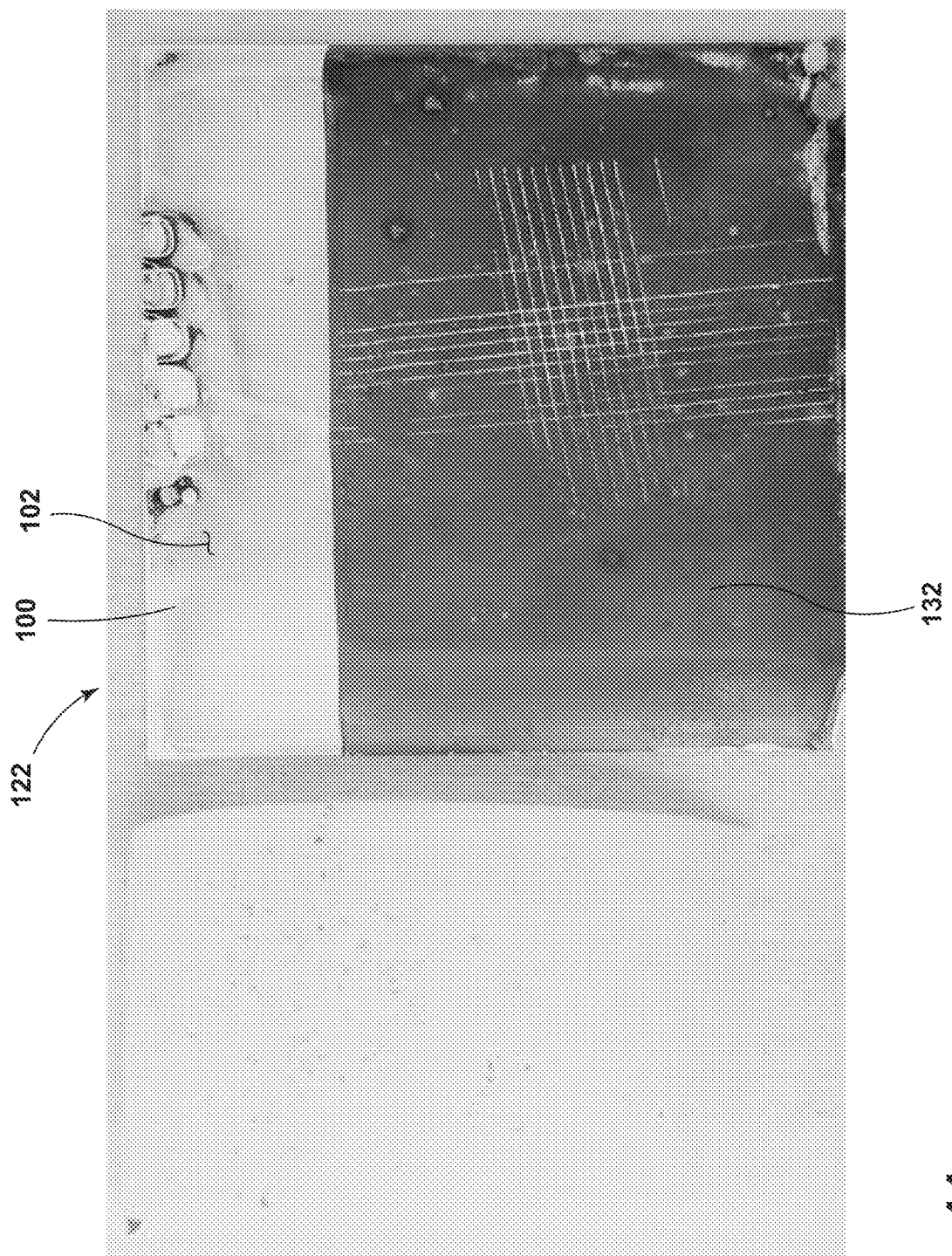
FIG. 11 is a picture of an example of a glass article manufactured according to the method of FIG. 3, illustrating that the metallic region bonded well to the glass substrate with no pieces of metal being separated from the glass substrate during a tape pull test.

Referring now to FIG. 11, the same cross-hatch tape test was performed on the resulting glass article 122 pursuant to ASTM D3359-09 (Standard Test Methods for Measuring Adhesion by Tape Test). The peeling of the tape removed 0% of the metallic region 132 from the glass article 122. In terms of the ASTM standard, the test result was 5B. This shows a high level of bonding of the silver (added as the first layer 120) and copper (added as the second layer 128) to the glass substrate 100.

Example 3. In Example 3, the glass substrate 100 was the Lotus NXT glass substrate 100 from Corning Incorporated (Corning, N.Y., USA). This glass substrate 100 was an alkaline earth aluminoborosilicate glass substrate 100, including aluminum oxide as a network former. The glass substrate 100 of Example 3 was otherwise subjected to the same method 200 as the glass substrate 100 of Example 2.

Figure 12:
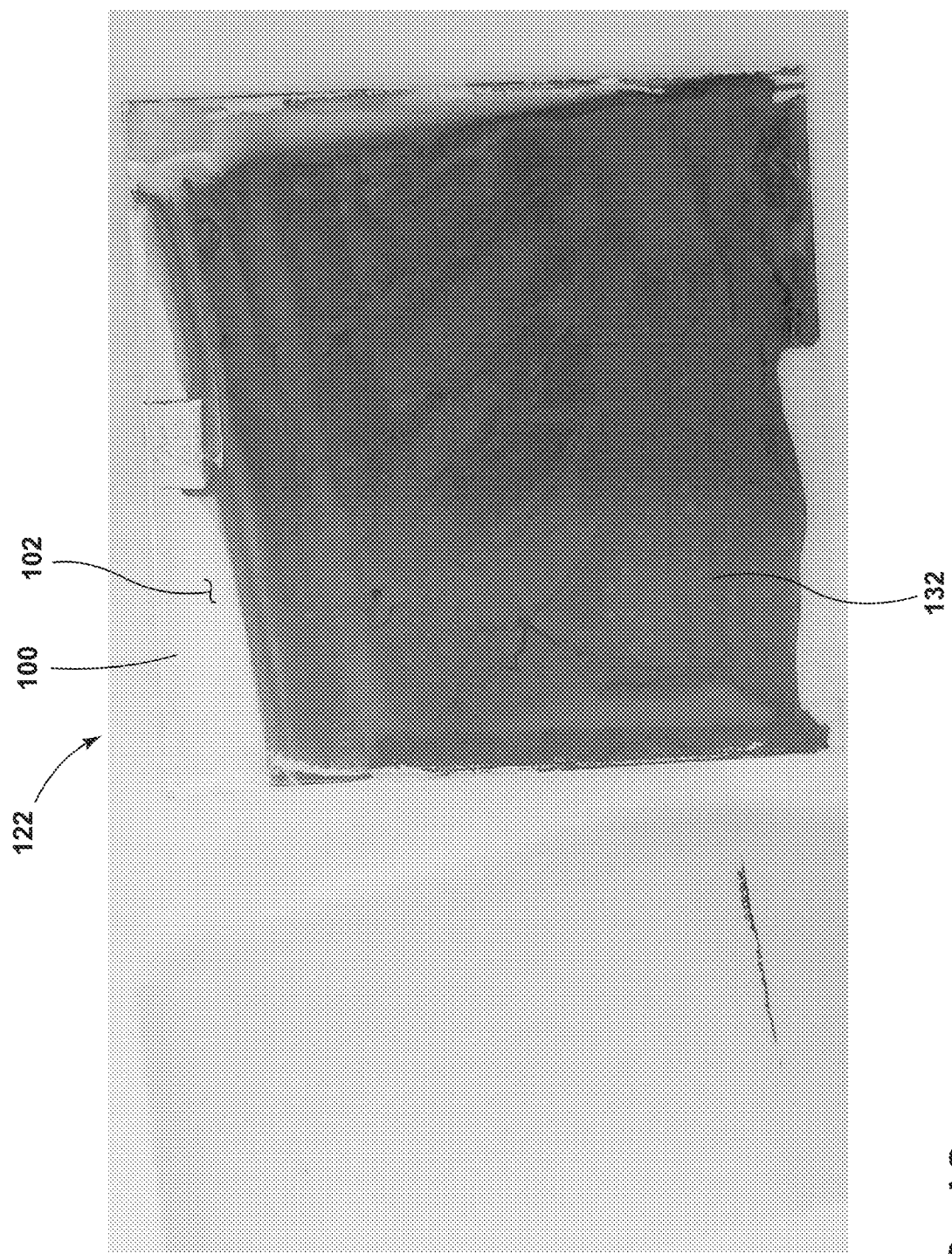
FIG. 12 is a picture of an example of a glass article manufactured according to the method of FIG. 3, illustrating that the metallic region bonded well to the glass substrate with no pieces of metal being separated from the glass substrate during a tape pull test.

Referring now to FIG. 12, the same cross-hatch tape test was performed on the resulting glass article 122 pursuant to ASTM D3359-09 (Standard Test Methods for Measuring Adhesion by Tape Test). The peeling of the tape removed 0% of the metallic region 132 from the glass article 122. In terms of the ASTM standard, the test result was 5B. This shows a high level of bonding of the silver (added as the first layer 120) and copper (added as the second layer 128) to the glass substrate 100.

Comparative Example 1. In this Comparative Example 1, the glass substrate 100 was the same as Example 2—the Eagle XG® available Corning Incorporated (Corning, N.Y., USA). The glass substrate 100 was subjected to the same steps of the method 200 as Example 2, except that the first thermal treatment step 204 of the glass substrate 100 with the first layer 120 of silver as the first metal was not performed.

Figure 13:
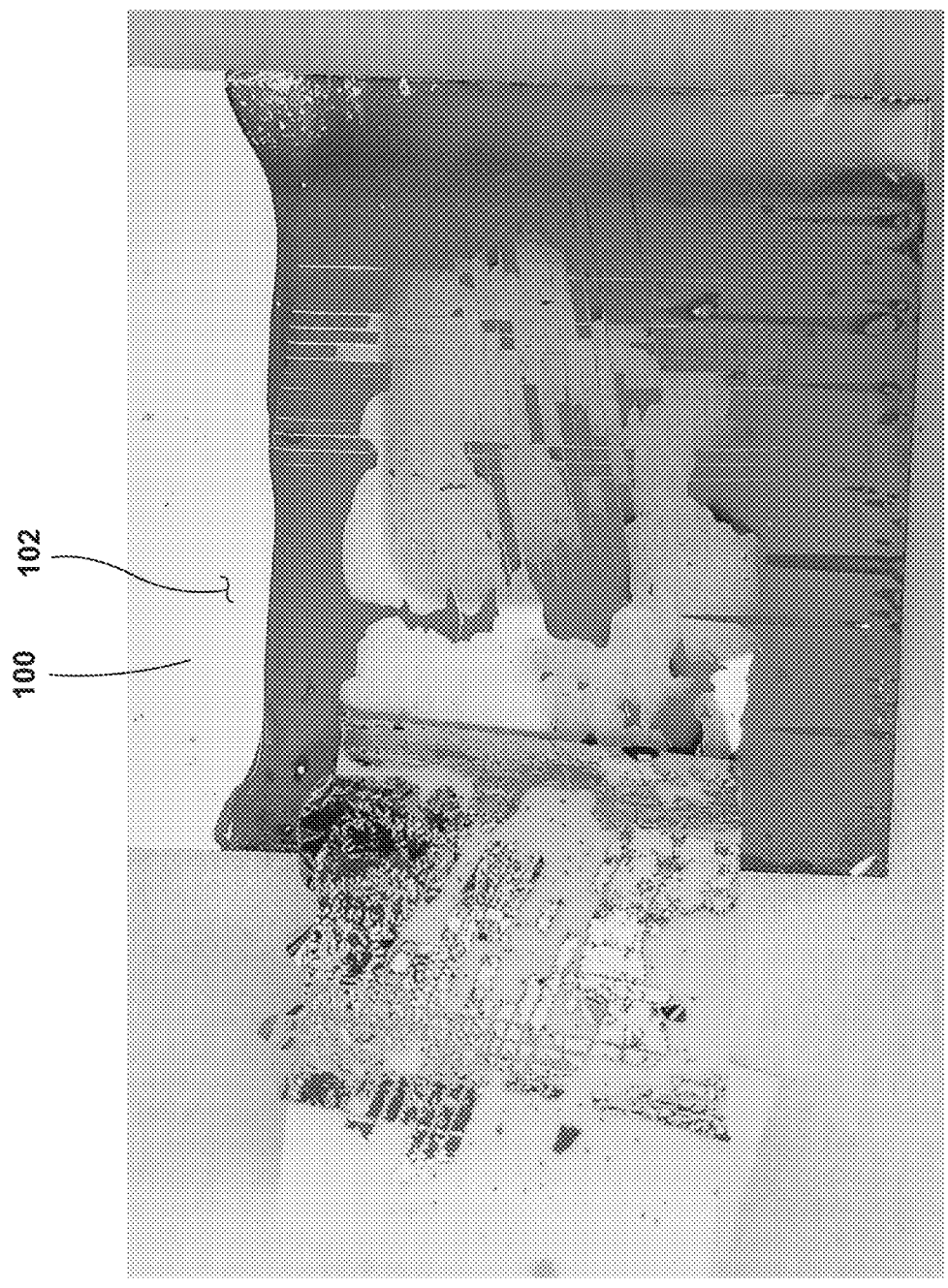
FIG. 13 is a picture of a comparative example of a glass article manufactured according to the method of FIG. 3, but lacking a step of thermally treating the first layer of the first metal, illustrating that the applied first layer of the first metal and second layer of the second metal bonded poorly to the glass substrate with large pieces of metal being separated from the glass substrate during a tape pull test.

Referring now to FIG. 13, after the remainder of the steps have been performed, the same cross-hatch tape test was performed on the resulting glass article 122 pursuant to ASTM D3359-09 (Standard Test Methods for Measuring Adhesion by Tape Test). The peeling of the tape removed significant percentages of the metallic region 132 from the glass substrate 100, demonstrating poor bonding of the copper and silver to the glass substrate 100. The poor bonding (adhesion) demonstrates that the first thermal treatment step 204 of the glass substrate 100 with the first layer 120 of the first metal is an important step of the method 200 to strongly bond of the second layer 128 of the second metal to the glass substrate 100.

Comparative Example 2. In this Comparative Example 2, the glass substrate 100 utilized was high purity fused silica. High purity fused silica does not include aluminum oxide as a network former. High purity fused silica has a relatively high softening temperature as a result. The glass substrate 100 was subjected to the same steps of the method 200 as Example 2—the only difference was the use of the high purity fused silica as the glass substrate 100 instead of Eagle XG® (which comprises aluminum oxide)

Figure 14:
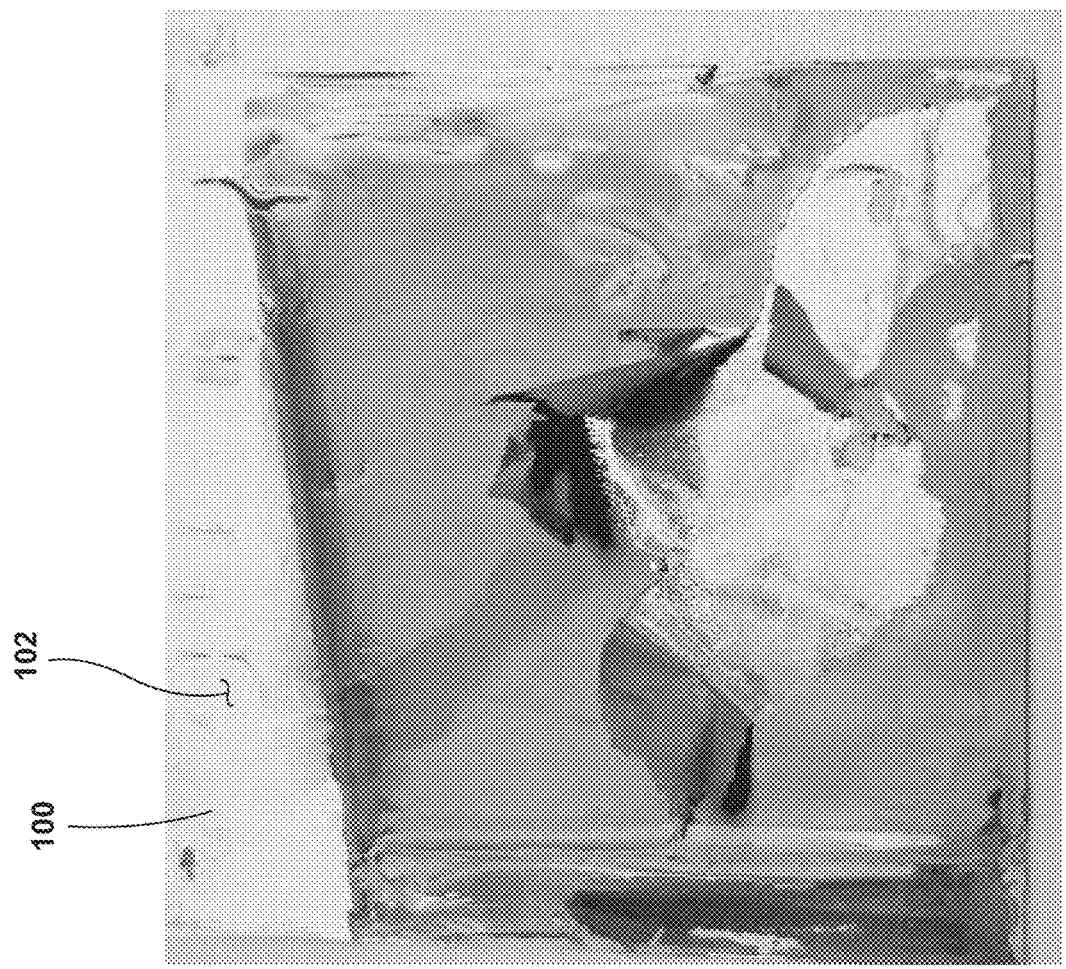
FIG. 14 is a picture of a comparative example of a glass article manufactured according to the method of FIG. 3, but with the glass substrate not comprising aluminum oxide, illustrating that the applied first layer of the first metal and second layer of the second metal bonded poorly to the glass substrate with large pieces of metal being separated from the glass substrate during a tape pull test.

Referring now to FIG. 14, after the remainder of the steps have been performed, the same cross-hatch tape test was performed on the applied layers of metal over the glass substrate 100 pursuant to ASTM D3359-09 (Standard Test Methods for Measuring Adhesion by Tape Test). The peeling of the tape removed significant percentages of the applied metals from the glass substrate 100, demonstrating poor bonding of the metals to the glass substrate 100. The poor bonding (adhesion) demonstrates that the presence of aluminum oxide in the composition of the glass substrate 100 is important to strongly bond the second layer 128 of the second metal to the glass substrate 100.

Comparative Example 3. In this Comparative Example 3, the glass substrate 100 was the same as Example 3—the Lotus NXT glass substrate 100 available from Corning Incorporated (Corning, N.Y., USA). The glass substrate 100 was subjected to the same steps of the method 200 as Examples 2 and 3, except that the first thermal treatment step 204 of the glass substrate 100 with the first layer 120 of the first metal was not performed.

Figure 15:
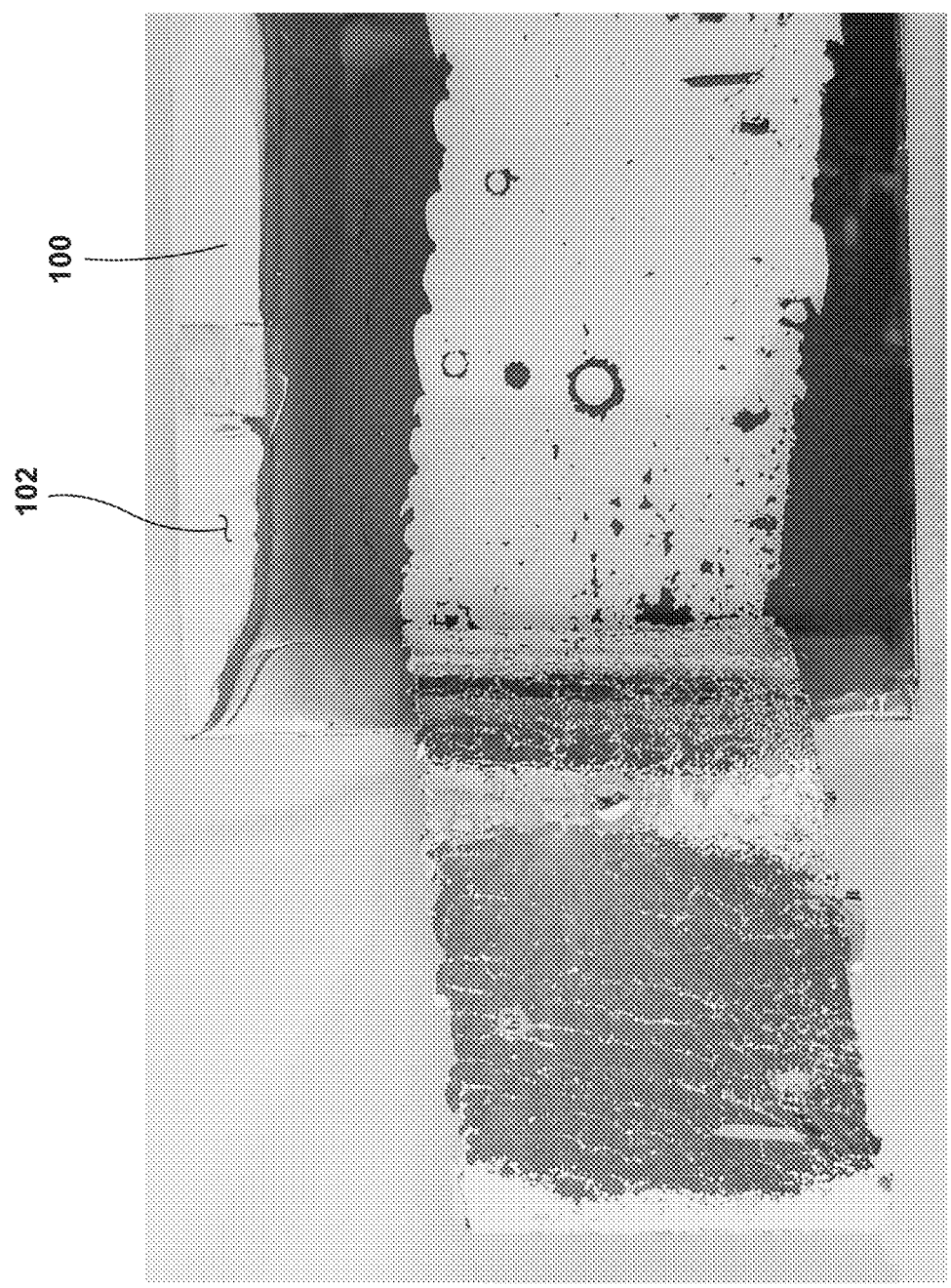
FIG. 15 is a picture of a comparative example of a glass article manufactured according to the method of FIG. 3, lacking a step of thermally treating the first layer of the first metal, illustrating that the applied first layer of the first metal and second layer of the second metal bonded poorly to the glass substrate with large pieces of metal being separated from the glass substrate during a tape pull test.

Referring now to FIG. 15, after the remainder of the steps have been performed, the same cross-hatch tape test was performed on the applied layers of metal over the glass substrate 100 pursuant to ASTM D3359-09 (Standard Test Methods for Measuring Adhesion by Tape Test). The peeling of the tape removed significant percentages of the applied metals from the glass substrate 10, demonstrating poor bonding of the metals to the glass substrate 100. The poor bonding (adhesion) demonstrates that the first thermal treatment step 204 of the glass substrate 100 with the first layer 120 of the first metal is an important step of the method 200 to strongly bond of the second layer 128 of the second metal to the glass substrate 100.

Aspect 1 of the description is:
A method of manufacturing a glass article comprising:
forming a first layer of a first metal on a glass substrate, the glass substrate comprising silicon dioxide and aluminum oxide;
subjecting the glass substrate with the first layer of the first metal to a first thermal treatment;
forming a second layer of a second metal over the first layer of the first metal; and
subjecting the second layer of the second metal to a second thermal treatment;
wherein the first thermal treatment and the second thermal treatment induces intermixing of the first metal, the second metal, and at least one of aluminum, aluminum oxide, silicon, and silicon dioxide of the glass substrate to form a metallic region comprising the first metal, the second metal, aluminum oxide, and silicon dioxide.

Aspect 2 of the description is:
The method of Aspect 1, wherein
the glass substrate has a first surface and a second surface, which are the primary surfaces of the glass substrate and face in generally opposite directions, and at least one via through the glass substrate defined by a sidewall surface extending from the first surface to the second surface; and
the first layer of the first metal is formed on the sidewall surface.

Aspect 3 of the description is:
The method of Aspect 1 or 2, wherein
the glass substrate is an alkaline earth aluminoborosilicate substrate, an alkali aluminosilicate glass substrate, or an alkali aluminoborosilicate glass substrate.

Aspect 4 of the description is:
The method of Aspect 1 or 2, wherein
the glass substrate is an alkali-free aluminoborosilicate glass substrate.

Aspect 5 of the description is:
The method of any of Aspects 1-4, wherein
the glass substrate has not been subjected to a procedure to roughen a surface of the glass substrate.

Aspect 6 of the description is:
The method of any of Aspects 1-5, wherein
the glass substrate has a composition comprising (on an oxide basis): 6 to 15 mol % $Al_2O_3$.

Aspect 7 of the description is:
The method of any of Aspects 1-5, wherein
the glass substrate has a composition comprising (on an oxide basis): 64.0 to 71.0 mol % $SiO_2$; 9.0 to 12.0 mol % $Al_2O_3$; 7.0 to 12.0 mol % $B_2O_3$; 1.0 to 3.0 mol % MgO; 6.0 to 11.5 mol % CaO; 0 to 2.0 mol % SrO; 0 to 0.1 mol % BaO; and at least 0.01 mole percent $SnO_2$;
wherein $1.00 \leq \Sigma[RO]/[Al_2O_3] \leq 1.25$, where $[Al_2O_3]$ is the mole percent of $Al_2O_3$ and $\Sigma[RO]$ equals the sum of the mole percents of MgO, CaO, SrO, and BaO.

Aspect 8 of the description is:
The method of any of Aspects 1-7, wherein
the first metal consists essentially of silver.

Aspect 9 of the description is:
The method of any of Aspects 1-7, wherein
the first metal comprises one or more of silver, palladium, platinum, ruthenium, nickel, cobalt, and gold.

Aspect 10 of the description is:
The method of any of Aspects 1-9, wherein
the forming the first layer of the first metal on the glass substrate comprises spin coating the glass substrate with a suspension of nanoparticles of the first metal.

Aspect 11 of the description is:
The method of any of Aspects 1-9, wherein
the forming the first layer of the first metal on the glass substrate comprises electroless plating.

Aspect 12 of the description is:
The method of any of Aspects 1-11, wherein
the first thermal treatment comprises subjecting the glass substrate with the first layer of the first metal to a temperature of 325° C. or greater.

Aspect 13 of the description is:
The method of any of Aspects 1-11, wherein
the first thermal treatment comprises subjecting the glass substrate with the first layer of the first metal to a temperature of 325° C. to 425° C.

Aspect 14 of the description is:
The method of any of Aspects 1-11, wherein
the first thermal treatment comprises subjecting the glass substrate with the first layer of the first metal to a temperature of 325° C. or greater for a time period of 45 minutes or longer.

Aspect 15 of the description is:
The method of any of Aspects 1-11, wherein
the first thermal treatment comprises subjecting the glass substrate with the first layer of the first metal to a temperature of 325° C. or greater for a time period of 45 minutes to 75 minutes.

Aspect 16 of the description is:
The method of any of Aspects 1-11, wherein
the first thermal treatment comprises subjecting the glass substrate with the first layer of the first metal to a temperature of 325° C. to 425° C. for a time period of 45 minutes to 75 minutes.

Aspect 17 of the description is:
The method of any of Aspects 1-16 further comprising:
after forming the first layer of the first metal and before forming the second layer of the second metal over the first layer of the first metal, determining that the first layer has either (a) a conductivity that is less than a predetermined conductivity or (b) a resistivity that is higher than a predetermined resistivity; and
electroless plating an intermediate layer of an intermediate metal over the first layer of the first metal;

wherein the forming the second layer of the second metal over the first layer of the first metal comprises forming the second layer of the second metal onto the intermediate layer of the intermediate metal; and wherein the first thermal treatment and the second thermal treatment induce intermixing of the first metal, the intermediate metal, the second metal, and at least one of aluminum, aluminum oxide, silicon, and silicon dioxide of the glass substrate to form a metallic region comprising the first metal, the second metal, aluminum oxide, and silicon dioxide.

Aspect 18 of the description is:
The method of any of Aspects 1-17, wherein
the forming the second layer of the second metal over the first layer of the first metal comprises electroplating the second layer of the second metal onto the first layer.

Aspect 19 of the description is:
The method of any of Aspects 1-18, wherein
the second thermal treatment comprises subjecting the glass substrate with the second layer of the second metal to a temperature of at least 300° C. for a time period of at least 20 minutes.

Aspect 20 of the description is:
The method of any of Aspects 1-18, wherein
the second thermal treatment comprises subjecting the glass substrate with the second layer of the second metal to a temperature of 300° C. to 400° C. for a time period of at least 20 minutes.

Aspect 21 of the description is:
A method of manufacturing a glass interposer comprising:

forming a first layer of a first metal on a sidewall surface of one or more vias of a glass substrate, the glass substrate comprising silicon dioxide and aluminum oxide;

subjecting the glass substrate with the first layer of the first metal to a first thermal treatment;

electroplating a second layer of a second metal over the first layer of the first metal to fully metalize the one or more vias; and subjecting the second layer of the second metal to a second thermal treatment, the first thermal treatment and the second thermal treatment inducing intermixing of the first metal, the second metal, and at least one of aluminum, aluminum oxide, silicon, and silicon dioxide of the glass substrate to form a metallic region comprising the first metal, the second metal, aluminum oxide, and silicon dioxide.

Aspect 22 of the description is:
The method of Aspect 21, wherein
the first metal consists essentially of silver; and
the second metal comprises copper.

Aspect 23 of the description is:
The method of Aspect 21 or 22, wherein
the first thermal treatment comprises subjecting the glass substrate with the first layer of the first metal to a temperature of 325° C. or greater for a time period of 45 minutes or longer.

Aspect 24 of the description is:
The method of Aspect 21 or 22, wherein
the first thermal treatment comprises subjecting the glass substrate with the first layer of the first metal to a temperature of 325° C. or greater for a time period of 45 minutes to 75 minutes.

Aspect 25 of the description is:
The method of Aspect 21 or 22, wherein
the first thermal treatment comprises subjecting the glass substrate with the first layer of the first metal to a temperature of 325° C. to 425° C. for a time period of 45 minutes to 75 minutes.

Aspect 26 of the description is:
The method of any of Aspects 21-25, wherein
the second thermal treatment comprises subjecting the glass substrate with the second layer of the second metal to a temperature of at least 300° C. for a time period of at least 20 minutes.

Aspect 27 of the description is:
The method of any of Aspects 21-25, wherein
the second thermal treatment comprises subjecting the glass substrate with the second layer of the second metal to a temperature of 300° C. to 400° C. for a time period of at least 20 minutes.

Aspect 28 of the description is:
The method of any of Aspects 21-27,
the glass substrate has a composition comprising (on an oxide basis): 64.0 to 71.0 mol % $SiO_2$; 9.0 to 12.0 mol % $Al_2O_3$; 7.0 to 12.0 mol % $B_2O_3$; 1.0 to 3.0 mol % MgO; 6.0 to 11.5 mol % CaO; 0 to 2.0 mol % SrO; 0 to 0.1 mol % BaO; and at least 0.01 mole percent $SnO_2$;
wherein, $1.00 \leq \Sigma[RO]/[Al_2O_3] \leq 1.25$, where $[Al_2O_3]$ is the mole percent of $Al_2O_3$ and $\Sigma[RO]$ equals the sum of the mole percents of MgO, CaO, SrO, and BaO; and wherein, the glass substrate has a coefficient of thermal expansion (CTE) of $20 \times 10^{-7}$ to $50 \times 10^{-7}$/° C.

Aspect 29 of the description is:
A glass article comprising:
a glass substrate comprising predominately (by weight percentage) silicon dioxide and aluminum oxide; and
a metallic region comprising a first metal, a second metal, silicon dioxide, and aluminum oxide,
the metallic region further comprising:
a sub-region α that comprises predominantly (by weight percentage) the second metal;
a sub-region β that comprises predominately (by weight percentage) the first metal, more of the second metal than silicon dioxide, and more of the second metal than aluminum oxide; and
a sub-region γ that comprises predominantly (by weight percentage) the first metal, more silicon dioxide than the second metal, and more aluminum oxide than the second metal;
wherein, of the sub-region α, the sub-region β, and the sub-region γ, the sub-region γ is closest to the glass substrate and the sub-region α is furthest from the glass substrate.

Aspect 30 of the description is:
The glass article of Aspect 29 further comprising:
a transitory region disposed between the glass substrate and the sub-region γ, the transitory region comprising (by weight percentage) predominantly silicon dioxide and more of the first metal than aluminum oxide.

Aspect 31 of the description is:
The glass article of Aspect 29 or 30, wherein aluminum oxide is contiguous from the glass substrate through the sub-region α.

Aspect 32 of the description is:
The glass article of any of Aspects 29-31, wherein
the glass article is an interposer comprising a first surface, a second surface, a thickness between the first surface and the second surface, and at least one via open to the first surface that extends at least partially through the thickness toward the second surface, each via being fully metallized with the metallic region disposed about a central axis of the via.

Aspect 33 of the description is:

The glass article of any of Aspects 29-32, wherein the first metal consists essentially of silver, and the second metal comprises copper.

It will be apparent to those skilled in the art that various modifications and variations can be made without departing from the spirit or scope of the claims.

What is claimed is:

1. A method of manufacturing a glass article comprising:
   forming a first layer of a first metal on a glass substrate, the glass substrate comprising silicon dioxide and aluminum oxide;
   subjecting the glass substrate with the first layer of the first metal to a first thermal treatment;
   forming a second layer of a second metal over the first layer of the first metal; and
   subjecting the second layer of the second metal to a second thermal treatment;
   wherein the first thermal treatment and the second thermal treatment induce intermixing of the first metal, the second metal, and at least one of aluminum, aluminum oxide, silicon, and silicon dioxide of the glass substrate to form a metallic region comprising the first metal, the second metal, aluminum oxide, and silicon dioxide.

2. The method of claim 1, wherein
   the glass substrate has a first surface and a second surface, which are the primary surfaces of the glass substrate and face in generally opposite directions, and at least one via through the glass substrate defined by a sidewall surface extending from the first surface to the second surface; and
   the first layer of the first metal is formed on the sidewall surface.

3. The method of claim 1, wherein
   the glass substrate is an alkaline earth aluminoborosilicate substrate, an alkali aluminosilicate glass substrate, or an alkali aluminoborosilicate glass substrate.

4. The method of claim 1, wherein
   the glass substrate is an alkali-free aluminoborosilicate glass substrate.

5. The method of claim 1, wherein
   the glass substrate has a composition comprising (on an oxide basis): 6 to 15 mol % $Al_2O_3$.

6. The method of claim 1, wherein
   the glass substrate has a composition comprising (on an oxide basis): 64.0 to 71.0 mol % $SiO_2$; 9.0 to 12.0 mol % $Al_2O_3$; 7.0 to 12.0 mol % $B_2O_3$; 1.0 to 3.0 mol % MgO; 6.0 to 11.5 mol % CaO; 0 to 2.0 mol % SrO; 0 to 0.1 mol % BaO; and at least 0.01 mol % $SnO_2$;
   wherein $1.00 \leq \Sigma[RO]/[Al_2O_3] \leq 1.25$, where $[Al_2O_3]$ is the mole percent of $Al_2O_3$ and $\Sigma[RO]$ equals the sum of the mole percents of MgO, CaO, SrO, and BaO.

7. The method of claim 1, wherein
   the first metal consists essentially of silver.

8. The method of claim 1, wherein
   the first metal comprises one or more of silver, palladium, platinum, ruthenium, nickel, cobalt, and gold.

9. The method of claim 1, wherein
   the forming the first layer of the first metal on the glass substrate comprises spin coating the glass substrate with a suspension of nanoparticles of the first metal.

10. The method of claim 1, wherein
    the forming the first layer of the first metal on the glass substrate comprises electroless plating.

11. The method of claim 1, wherein
    the first thermal treatment comprises subjecting the glass substrate with the first layer of the first metal to a temperature of 325° C. or greater for a time period of 45 minutes or longer.

12. The method of claim 1, wherein
    the first thermal treatment comprises subjecting the glass substrate with the first layer of the first metal to a temperature of 325° C. to 425° C. for a time period of 45 minutes to 75 minutes.

13. The method of claim 1 further comprising:
    after forming the first layer of the first metal and before forming the second layer of the second metal over the first layer of the first metal, determining that the first layer has either (a) a conductivity that is less than a predetermined conductivity or (b) a resistivity that is higher than a predetermined resistivity; and
    electroless plating an intermediate layer of an intermediate metal over the first layer of the first metal;
    wherein the forming the second layer of the second metal over the first layer of the first metal comprises forming the second layer of the second metal onto the intermediate layer of the intermediate metal; and
    wherein the first thermal treatment and the second thermal treatment induce intermixing of the first metal, the intermediate metal, the second metal, and at least one of aluminum, aluminum oxide, silicon, and silicon dioxide of the glass substrate to form a metallic region comprising the first metal, the second metal, aluminum oxide, and silicon dioxide.

14. The method of claim 1, wherein
    the forming the second layer of the second metal over the first layer of the first metal comprises electroplating the second layer of the second metal onto the first layer.

15. The method of claim 1, wherein
    the second thermal treatment comprises subjecting the glass substrate with the second layer of the second metal to a temperature of at least 300° C. for a time period of at least 20 minutes.

16. The method of claim 1, wherein the second metal comprises copper.

17. The method of claim 1, wherein the first metal is silver and the second metal is an alloy of copper and manganese.

18. The method of claim 1, wherein before the glass substrate with the first layer is subjected to the first thermal treatment, the first layer of the first metal comprises a monolayer or multiple layers of nanoparticles of the first metal.

* * * * *

UNITED STATES PATENT AND TRADEMARK OFFICE
CERTIFICATE OF CORRECTION

PATENT NO. : 11,798,815 B2
APPLICATION NO. : 17/123576
DATED : October 24, 2023
INVENTOR(S) : Philip Simon Brown et al.

Page 1 of 1

It is certified that error appears in the above-identified patent and that said Letters Patent is hereby corrected as shown below:

In the Claims

In Column 27, Line 46, in Claim 6, delete "$SiO_2$:" and insert -- $SiO_2$; --.

Signed and Sealed this
Thirty-first Day of December, 2024

Derrick Brent
*Acting Director of the United States Patent and Trademark Office*